United States Patent
Borade et al.

(10) Patent No.: US 11,360,222 B2
(45) Date of Patent: *Jun. 14, 2022

(54) LANTHANIDE DOPED CESIUM BARIUM HALIDE SCINTILLATORS

(71) Applicant: The Regents of the University of California, Oakland, CA (US)

(72) Inventors: Ramesh B. Borade, Livermore, CA (US); Gregory A. Bizarri, Grendon Underwood (GB); Edith D. Bourret-Courchesne, Berkeley, CA (US); Stephen E. Derenzo, Pinole, CA (US); Stephen M. Hanrahan, Berkeley, CA (US); Zewu Yan, Albany, CA (US); Anurag Chaudry, Portland, OR (US); Andrew Canning, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/024,590

(22) Filed: Sep. 17, 2020

(65) Prior Publication Data
US 2021/0003720 A1 Jan. 7, 2021

Related U.S. Application Data

(63) Continuation of application No. 14/731,302, filed on Jun. 4, 2015, now Pat. No. 10,795,032, which is a (Continued)

(51) Int. Cl.
*G01T 1/202* (2006.01)
*C09K 11/77* (2006.01)
(Continued)

(52) U.S. Cl.
CPC ........ *G01T 1/2023* (2013.01); *C09K 11/7705* (2013.01); *C09K 11/7733* (2013.01); *C30B 29/12* (2013.01); *G21K 4/00* (2013.01)

(58) Field of Classification Search
CPC .............. G01T 1/2023; C09K 11/7733; C09K 11/7705; C30B 29/12
See application file for complete search history.

(56) References Cited

U.S. PATENT DOCUMENTS

| 3,373,279 A | 3/1968 | Hofstadter et al. |
| 3,988,252 A | 10/1976 | Ferretti |

(Continued)

FOREIGN PATENT DOCUMENTS

JP  2007-045869  7/2007

OTHER PUBLICATIONS

Gahana et al, "Luminesence of Some Eu2+ Activated Bromides", Journal of Alloys and Compounds, 484, (2009), pp. 660-664, May 12, 2009.*

(Continued)

*Primary Examiner* — C Melissa Koslow
(74) *Attorney, Agent, or Firm* — Robin C. Chiang; Lawrence Berkeley National Laboratory

(57) ABSTRACT

The present invention provides for a composition comprising an inorganic scintillator comprising an optionally lanthanide-doped cesium barium halide, useful for detecting nuclear material.

31 Claims, 26 Drawing Sheets

Related U.S. Application Data continuation of application No. 13/272,152, filed on Oct. 12, 2011, now Pat. No. 9,053,832, which is a continuation-in-part of application No. 12/986,103, filed on Jan. 6, 2011, now Pat. No. 8,486,300, and a continuation-in-part of application No. PCT/US2010/034130, filed on May 7, 2010, and a continuation-in-part of application No. PCT/US2010/029719, filed on Apr. 1, 2010.

(60) Provisional application No. 61/392,438, filed on Oct. 12, 2010, provisional application No. 61/292,796, filed on Jan. 6, 2010, provisional application No. 61/232,371, filed on Aug. 7, 2009, provisional application No. 61/176,454, filed on May 7, 2009.

(51) Int. Cl.
*C30B 29/12* (2006.01)
*G21K 4/00* (2006.01)

(56) References Cited

U.S. PATENT DOCUMENTS

| | | | |
|---|---|---|---|
| 4,089,799 A | 5/1978 | Sommerdijk et al. | |
| 4,871,474 A | 10/1989 | Katoh et al. | |
| 4,999,515 A | 3/1991 | Nakamura et al. | |
| 7,141,794 B2 | 11/2006 | Srivastava et al. | |
| 7,202,478 B2 | 4/2007 | Ramsden et al. | |
| 8,486,300 B2 | 7/2013 | Gundiah et al. | |
| 8,580,149 B2 | 11/2013 | Payne et al. | |
| 8,692,203 B1 | 4/2014 | Fang et al. | |
| 8,829,445 B1 * | 9/2014 | Nagarkar | G01T 7/00 250/362 |
| 8,957,386 B1 * | 2/2015 | Nagarkar | C09K 11/7719 250/362 |
| 9,053,832 B2 * | 6/2015 | Bizarri | G21K 4/00 |
| 9,695,356 B1 * | 7/2017 | Stand | G01T 1/2023 |
| 2005/0285042 A1 | 12/2005 | Joung | |
| 2007/0131874 A1 | 6/2007 | Srivastava et al. | |
| 2007/0170396 A1 | 7/2007 | Appleby et al. | |
| 2010/0044576 A1 | 2/2010 | Payne et al. | |
| 2012/0273726 A1 | 11/2012 | Zhuravleva et al. | |

OTHER PUBLICATIONS

S.E. Derenzo et al, "The quest for ideal inorganic scintillator", Nuclear Instruments and Methods in Physics Research A, 2003, 505, 111-117.
S.E. Derenzo et al, "Design and Implementation of a Facility for Discovering New Scintillator Materials", IEEE Transactions on Nuclear Science, 2008, 55, 1458-1463.
R. Boutchko et al,"Cerium Activated Scintillation in Yttrium Halides: First Principles Theory and Prediction", IEEE Transactions on Nuclear Science; 2009, 56, 977-981.
E.D. Bourret-Courchesne et al, "Eu2+-doped Ba2CsI5, A New High-Performance Scintillator", Nuclear Instruments and Methods in Physics Research A, 2009, 612, 138-142.
G. Gundiah et al, "Scintillation properties of Eu2+ -activated barium fluoroiodide", IEEE Nuclear Sciences Symposium Conference Record, 2009, N25-143, 1575-1578.
G. Gundiah et al, "Europium-doped barium bromide iodide", Acta Crystallographica Section E, 2009, E65, i76-i77.
E.D. Bourret-Courchesne et al, "BaBrI:Eu2+, a new bright scintillator", Nuclear Instruments and Methods in Physics Research A, 2010, 95-97.
M.D. Birowosuto et al, "Ce3+ activated LaBr3-xLx: High-light-yield and fast-response mixed halide scintillators", Journal of Applied Physics, 2008, 103517.
J. Selling et al, "Europium-doped barium halide scintillators for x-ray and -ray detections", Journal of Applied Physics, 2007, 101, 034901.
J. Selling et al, "Eu- or Ce-Doped Barium Halide Scintillators for X-Ray and Gamma-Ray Detections", IEEE Transactions of Nuclear Science, vol. 55, No. 3, 1183-1185, 2008.
E. Bourret-Courchesne et al, "Growth and Scintillation Properties of BaBrI: Eu2+ and Ba2CsI5: Eu2+ crystals", Nuclear Science Symposium Medical Imaging Conference, 2009.
E. Bourret-Courchesne et al, "Growth of Small Crystals for Screening Scintillator Materials", SCINT2009, 2009.
N.J. Cherepy et al, "Strontium and Barium Iodide High Light Yield Scintillators", Applied Physics Letters, 2008, 92, 083508.
N.J. Cherepy et al, "Scintllators With Potential to Supersede Lanthanum Bromide", IEEE Transactions on Nuclear Science, 2009, vol. 56, No. 3, 873.
J. Selling et al, "Cerium-doped barium halide scintillators for x-ray and gamma-ray detections", Journal of Applied Physics, 2007, 102, 074915.
J. Selling et al, "Europium-doped barium halide x-ray scintillators", Phys. Stat. Sol., 2007, vol. 4, No. 3, 976-979.
PCT International Patent Application No. PCT/US10/29719, International Search Report.
PCT International Patent Application No. PCT/US10/29719, Written Opinion.
PCT International Patent Application No. PCT/US10/29719, International Preliminary Report on Patentability.
C.W.E. Eijk, "Inorganic scintillators in medical imaging", Phys. Med. Biol., 2002, 47, R85-R106.
Gahane et al., "Luminescence of soe Eu2+ activated bromides", Journal of Alloys and Compounds, 484, Apr. 2009, 60-664.
Lenus et al., "Luminescence behavior of Eu2+ doped BacII and BaBeI", Materials Letters, 57, 2002, pp. 635-638.

* cited by examiner

LANTHANIDE DOPED CESIUM BARIUM HALIDE SCINTILLATORS

RELATED PATENT APPLICATIONS

The application claims priority as a continuation application to U.S. patent application Ser. No. 14/731,302, filed Jun. 4, 2015, now U.S. Pat. No. 10,795,032, issued Oct. 6, 2020, which in turn claims priority as a continuation application to U.S. patent application Ser. No. 13/272,152, filed Oct. 12, 2011, now U.S. Pat. No. 9,053,832, issued Jun. 9, 2015, which in turn claims priority: (I) as a continuation-in-part application to PCT International Patent Application No. PCT/US10/34130, filed May 7, 2010, which claims priority to U.S. Provisional Patent Application Ser. No. 61/176,454, filed May 7, 2009; (II) as a continuation-in-part application to PCT International Patent Application No. PCT/US10/29719, filed Apr. 1, 2010, which claims priority to U.S. Provisional Patent Application Ser. No. 61/232,371, filed Aug. 7, 2009; (III) as a continuation-in-part application to U.S. patent application Ser. No. 12/986,103, filed Jan. 6, 2011, issued as U.S. Pat. No. 8,486,300 on Jul. 16, 2013, and now reissued as U.S. Pat. No. RE45930, issued Mar. 15, 2016, which claims priority to U.S. Provisional Patent Application Ser. No. 61/292,796, filed Jan. 6, 2010; and (IV) to U.S. Provisional Patent Application Ser. No. 61/392,438, filed Oct. 12, 2010; all of which are hereby incorporated herein by reference.

STATEMENT OF GOVERNMENTAL SUPPORT

The invention was made with government support under Grant No. HSHQDC-07-X-00170 awarded by the U.S. Department of Homeland Security, and Contract No. DE-AC02-05CH11231 awarded by the U.S. Department of Energy. The government has certain rights in the invention.

FIELD OF THE INVENTION

The present invention is in the field of inorganic crystals with scintillation properties useful as gamma-ray detectors.

BACKGROUND OF THE INVENTION

The need for radiation detecting materials has been at the forefront of materials research in recent years due to applications in national security, medical imaging, X-ray detection, oil well logging, and high-energy physics. Essential qualities that a scintillator must possess are high light yields, fast luminescence decay (below 1000 ns), good stopping power, high density, good energy resolution, ease of growth, proportionality, and stability under ambient conditions. $La_xBr_3:Ce_{1-x}$ (E.V.D. van Loef et al, Appl. Phys. Lett., 2001, 79, 1573) and $Sr_xI_2:Eu_{1-x}$ (N. Cherepy et al, Appl. Phys. Lett. 2007, 92, 083508) are present day benchmark materials that satisfy some of the desired criteria, but their application is limited due to the extreme hygroscopic nature.

Barium mixed halides, such as barium fluoride iodide (BaFI) doped with Eu, have been studied as a photostimulable phosphor since the mid 1980's for applications in computed radiology (K. Takahashi et al, J. Electrochem. Soc, 1985, 132, 1492). However, none of these have been identified as candidate scintillators for detecting gamma rays.

SUMMARY OF THE INVENTION

The present invention provides for a composition comprising an inorganic scintillator comprising an optionally lanthanide-doped strontium-barium, optionally cesium, halide, useful for detecting nuclear material.

The present invention provides for an inorganic scintillator having the formula:

$$Sr_xBa_yCs_vX_w:Ln^1_z \qquad (I);$$

wherein X is a halogen (such as F, Cl, Br, I and At), or a mixture thereof; $Ln^1$ is a lanthanide with a valence of 2+; v has a value having the range $0 \leq v \leq 4$; w has a value having the range $2 \leq w \leq 6$; x has a value having the range $0 \leq x-2$; y has a value having the range $0 \leq y \leq 2$; z has a value having the range $0 \leq z \leq 2$; and, x+y+z=1 or 2; and with the proviso that when v=0 then X is a mixture of two or more halogen elements, and that the inorganic scintillator is not $BaFCl:Eu^{2+}$, $BaFBr:Eu^{2+}$, $BaFI:Eu^{2+}$, $BaBrCl:Eu^{2+}$, $BaClI:Eu^{2+}$, $BaBrI:Eu^{2+}$, EuFCl, EuFBr, and/or EuFI. In some embodiments, the inorganic scintillator has the formula (I), wherein when x+y+z=1 then v=0 and w=2, v=1 and w=3 or 5, v=2 and w=4, or v=4 and w=6; and, when x+y+z=2 then v=1 and w=5. In some embodiments, z has a value having the range $0 < z \leq 1$ or $0 < z \leq 2$. In some embodiments, X is F, Cl, Br, or I, or a mixture thereof. In some embodiments, X is Cl, Br, or I, or a mixture thereof. When x+y+z=1 then x has a value having the range $0 \leq x \leq 1$; y has a value having the range $0 \leq y \leq 1$; z has a value having the range $0 \leq z \leq 1$. When x+y+z=2 then x has a value having the range $0 \leq x \leq 2$; y has a value having the range $0 \leq y \leq 2$; z has a value having the range $0 \leq z \leq 2$.

In some embodiments, the inorganic scintillator has the formula (I), wherein v=1, w=5, and x+y+z=2. In some embodiments, the inorganic scintillator has the formula (I), wherein v=1, w=3, and x+y+z=1. In some embodiments, the inorganic scintillator has the formula (I), wherein v=2, w=4, and x+y+z=1. In some embodiments, the inorganic scintillator has the formula (I), wherein v=4, w=6, and x+y+z=1. In some embodiments, the inorganic scintillator has the formula (I), wherein v=0, w=2, and x+y+z=1.

In some embodiments, the inorganic scintillator has the formula:

$$Sr_xBa_yCs_vX_w:Ln^1_z \qquad (II);$$

wherein X is a halogen (such as F, Cl, Br, I and At), or a mixture thereof; $Ln^1$ is a lanthanide with a valence of 2+; v=1; w=5; x has a value having the range $0 \leq x \leq 2$; y has a value having the range $0 \leq y \leq 2$; z has a value having the range $0 \leq z \leq 2$; and, x+y+z=2.

In some embodiments, the inorganic scintillator has the formula:

$$Sr_xBa_yCs_vX_w:Ln^1_z \qquad (III);$$

wherein X is a halogen (such as F, Cl, Br, I and At), or a mixture thereof; $Ln^1$ is a lanthanide with a valence of 2+; v=1; w=3; x has a value having the range $0 \leq x \leq 1$; y has a value having the range $0 \leq y \leq 1$; z has a value having the range $0 \leq z \leq 1$; and, x+y+z=1.

In some embodiments, the inorganic scintillator has the formula:

$$Sr_xBa_yCs_vX_w:Ln^1_z \qquad (IV);$$

wherein X is a halogen (such as F, Cl, Br, I and At), or a mixture thereof; $Ln^1$ is a lanthanide with a valence of 2+; v=2; w=4; x has a value having the range $0 \leq x \leq 1$; y has a value having the range $0 \leq y \leq 1$; z has a value having the range $0 \leq z \leq 1$; and, x+y+z=1.

In some embodiments, the inorganic scintillator has the formula:

$$Sr_xBa_yCs_vX_w:Ln^1_z \qquad (V);$$

wherein X is a halogen (such as F, Cl, Br, I and At), or a mixture thereof; $Ln^1$ is a lanthanide with a valence of 2+; v=4; w=6; x has a value having the range $0 \leq x \leq 1$; y has a value having the range $0 \leq y \leq 1$; z has a value having the range $0 \leq z \leq 1$; and, x+y+z=1.

In some embodiments, the inorganic scintillator has the formula:

$$Sr_xBa_yX_w:Ln^1_z \quad (VI);$$

wherein X is a mixture of two of more halogen elements (such as F, Cl, Br, I and At); $Ln^1$ is a lanthanide with a valence of 2+; w=2; x has a value having the range $0 \leq x \leq 1$; y has a value having the range $0 \leq y \leq 1$; z has a value having the range $0 \leq z \leq 1$; and, x+y+z=1.

The present invention also provides for an inorganic scintillator having the formula:

$$Sr_xBa_yCs_vX_w:Ln^2_z \quad (VII);$$

wherein X is a halogen (such as F, Cl, Br, I and At), or a mixture thereof; $Ln^2$ is a lanthanide with a valence of 3+; v has a value having the range $0 \leq v \leq (4-z)$; w has a value having the range $2 \leq w \leq 6$; x has a value having the range $0 \leq x \leq 2$; y has a value having the range $0 \leq y \leq 2$; z has a value having the range $0 \leq z \leq 2$; and, x+y+z=1 or 2; and optionally with the proviso that when v=0 then X is a mixture of two or more halogen elements. In some embodiments, the inorganic scintillator has the formula (VII), wherein when x+y+z=1 then v=1-z and w=3 or 5, v=2-z and w=4, or v=4-z and w=6; and, when x+y+z=2 then v=1-z and w=5. In some embodiments, z has a value having the range $0<z\leq1$ or $0<z\leq2$. In some embodiments, X is F, Cl, Br, or I, or a mixture thereof. In some embodiments, X is Cl, Br, or I, or a mixture thereof. When x+y+z=1 then x has a value having the range $0 \leq x \leq 1$; y has a value having the range $0 \leq y \leq 1$; z has a value having the range $0 \leq z \leq 1$. When x+y+z=2 then x has a value having the range $0 \leq x < 2$; y has a value having the range $0 \leq y < 2$; z has a value having the range $0 \leq z < 2$.

In some embodiments, the inorganic scintillator has the formula (I), wherein v=1-z, w=5, and x+y+z=2. In some embodiments, the inorganic scintillator has the formula (I), wherein v=1-z, w=3, and x+y+z=1. In some embodiments, the inorganic scintillator has the formula (I), wherein v=2-z, w=4, and x+y+z=1. In some embodiments, the inorganic scintillator has the formula (I), wherein v=4-z, w=6, and x+y+z=1.

In some embodiments, the inorganic scintillator has the formula:

$$Sr_xBa_yCs_vX_w:Ln^2_z \quad (VIII);$$

wherein X is a halogen (such as F, Cl, Br, I and At), or a mixture thereof; $Ln^2$ is a lanthanide with a valence of 3+; v=1-z; w=5; x has a value having the range $0 \leq x < 2$; y has a value having the range $0 \leq y \leq 2$; z has a value having the range $0 \leq z \leq 1$; and, $x_+y_+z=2$.

In some embodiments, the inorganic scintillator has the formula:

$$Sr_xBa_yCs_vX_w:Ln^2_z \quad (IX);$$

wherein X is a halogen (such as F, Cl, Br, I and At), or a mixture thereof; $Ln^2$ is a lanthanide with a valence of 3+; v=1-z; w=3; x has a value having the range $0 \leq x \leq 1$; y has a value having the range $0 \leq y \leq 1$; z has a value having the range $0 \leq z \leq 1$; and, $x_+y_+z=1$.

In some embodiments, the inorganic scintillator has the formula:

$$Sr_xBa_yCs_vX_w:Ln^2_z \quad (X);$$

wherein X is a halogen (such as F, Cl, Br, I and At), or a mixture thereof; $Ln^2$ is a lanthanide with a valence of 3+; v=2-z; w=4; x has a value having the range $0 \leq x < 1$; y has a value having the range $0 \leq y \leq 1$; z has a value having the range $0 \leq z \leq 1$; and, x+y+z=1.

In some embodiments, the inorganic scintillator has the formula:

$$Sr_xBa_yCs_vX_w:Ln^2_z \quad (XI);$$

wherein X is a halogen (such as F, Cl, Br, I and At), or a mixture thereof; $Ln^2$ is a lanthanide with a valence of 3+; v=4-z; w=6; x has a value having the range $0 \leq x \leq 1$; y has a value having the range $0 \leq y \leq 1$; z has a value having the range $0 \leq z \leq 1$; and, $x_+y_+z=1$.

In some embodiments of the invention, X, $X^1$ and $X^2$ are each independently F, Cl, Br, I, or At. In some embodiments of the invention, lanthanide can be La, Ce, Pr, Nd, Pm, Sm, Eu, Gd, Tb, Dy, Ho, Er, Tm, Yb, or Lu. Examples of lanthanides with a valence of 2+ are Eu and Yb. Examples of lanthanides with a valence of 3+ are Ce and Yb. The inorganic scintillator is a scintillator that produces a bright luminescence upon irradiation by a suitable radiation, such as gamma radiation.

In some embodiments of the invention, z has a value having the range $0 \leq z \leq 2$, $0 \leq z \leq 1$, $0.001 \leq z \leq 2$, $0.001 \leq z \leq 1$, $0.001 \leq z \leq 0.5$, $0.01 \leq z \leq 2$, $0.01 \leq z \leq 1$, $0.01 \leq z \leq 0.5$, $0.1 \leq z \leq 2$, $0.1 \leq z \leq 1$, or $0.1 \leq z \leq 0.5$. In some embodiments of the invention, where $Ln^1$ or $Ln^2$ is indicated as a percentage, suitable amounts of $Ln^1$ or $Ln^2$ range from over 0% to 10%, over 0% to 7%, over 0% to 5%, 1% to 10%, 1% to 5%, 1% to 4%, or 2% to 3%.

In some embodiments of the invention, the inorganic scintillator is a single crystal having at least one dimension of a length of at least 1 mm, at least 5 mm, at least 1 cm, or at least 3 cm, or a length at least sufficient to stop or absorb gamma-radiation.

The present invention provides for an inorganic scintillator described and/or having one or more of the properties described in Examples 1-11.

The present invention also provides for a composition comprising essentially of a mixture of halide salts (comprising optionally Sr halide, optionally Ba halide, Cs halide, and $Ln^1$ or $Ln^2$ halide) useful for producing the inorganic scintillator of the present invention, wherein each elements relative to each other within the composition have a stoichiometry essentially equivalent to the stoichiometry of the elements in the compounds of formulae (I)-(XI), or any other formulae, as described herein.

The halide salts can be powdered crystals. The halide salts are essentially pure. Such halide salts are commercially available.

The present invention further provides for a method for producing the composition comprising an inorganic scintillator as described herein comprising: (a) providing a composition comprising essentially of a mixture of halide salts described herein useful for producing the inorganic scintillator as described herein, (b) heating the mixture so that the halide salts start to react, and (c) cooling the mixture to room temperature such that the composition comprising an inorganic scintillator is formed.

The invention provides for a device comprising a composition comprising an inorganic scintillator of the present invention and a photodetector. The device is useful for the detection of an ionizing radiation, such as gamma radiation. The device is useful for industrial, medical, protective and defensive purpose or in the oil and nuclear industry.

In some embodiments of the invention, the device is a gamma ray (or like radiation) detector which comprises a single crystal of inorganic scintillator or lanthanide-doped strontium-barium cesium halide of the present invention. When assembled in a complete detector, the scintillator crystal is optically coupled, either directly or through a suitable light path, to the photosensitive surface of a photodetector for generation of an electrical signal in response to the emission of a light pulse by the scintillator. The inorganic scintillator of the invention possesses certain important characteristics, most notably high light output, very short decay time and high detection efficiency, which make it superior to prior scintillators as a gamma ray or like radiation detector, in particular for homeland security applications, such as nuclear material detection.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE INVENTION

Figure 1:
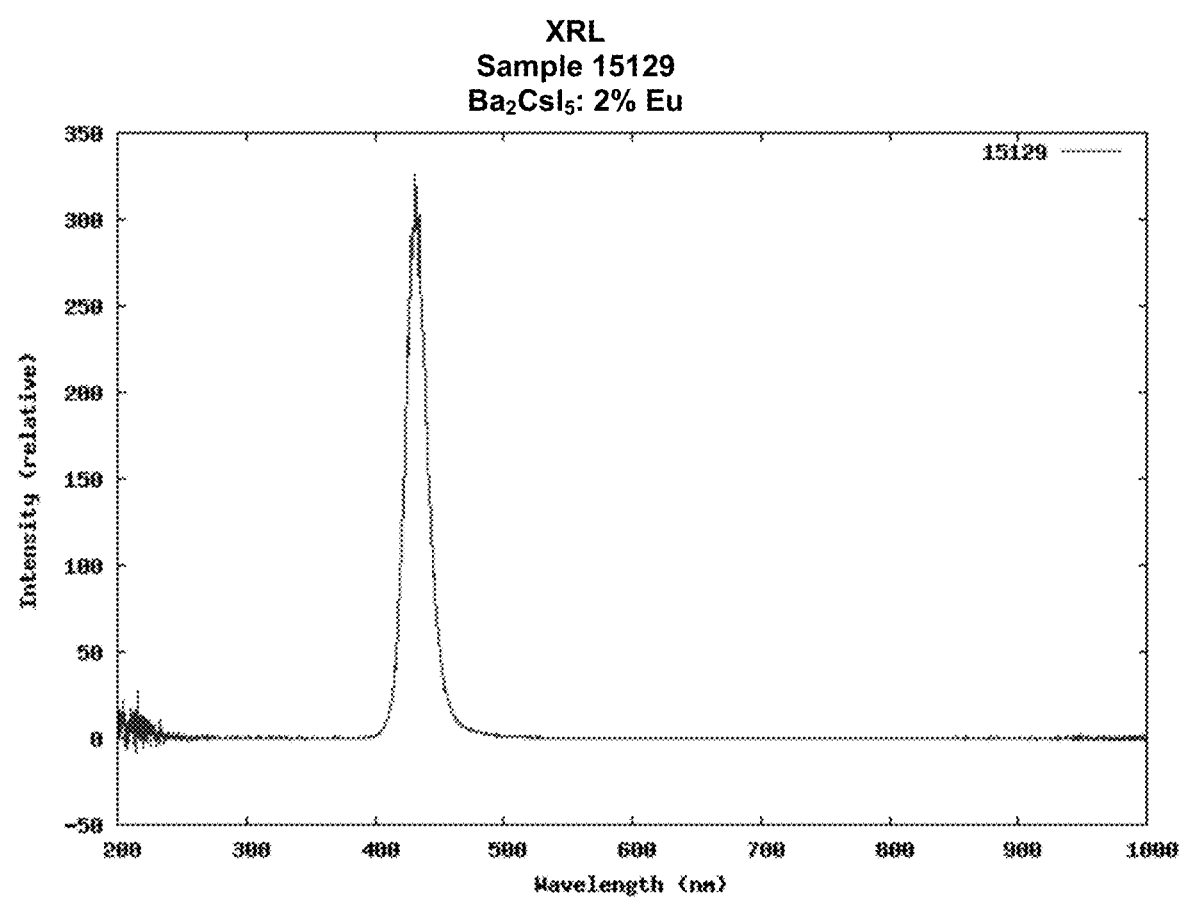
FIG. 1 shows the emission spectrum of a $Ba_2CsI_5$:2% Eu crystal under x-ray excitation.

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

As used in the specification and the appended claims, the singular forms "a", "an", and "the" include plural references unless the context clearly dictates otherwise. Thus, for example, reference to a "crystal" includes a single crystal as well as a plurality of crystals.

The term "strontium-barium" means strontium only, barium only, or a mixture thereof.

The terms "optional" or "optionally" as used herein mean that the subsequently described feature or structure may or may not be present, or that the subsequently described event or circumstance may or may not occur, and that the description includes instances where a particular feature or structure is present and instances where the feature or structure is absent, or instances where the event or circumstance occurs and instances where it does not.

These and other objects, advantages, and features of the invention will become apparent to those persons skilled in the art upon reading the details of the invention as more fully described below.

The Inorganic Scintillators

Useful qualities for the inorganic scintillators of the present invention are high light yields, fast luminescence decay (such as, equal to or less 1000 ns), good stopping power, high density, good energy resolution, ease of growth, and stability under ambient conditions.

In some embodiments, the inorganic scintillator has the formula:

$$Sr_yBa_zCsX_5:Ln^1_X \quad \text{(IIa)};$$

wherein X is Br, Cl, I, or a mixture thereof; Ln' is a lanthanide with a valence of 2+; x has a value having the range 0<x<2; y has a value having the range 0≤y<2; z has a value having the range 0≤<2; y+z>0; and, x+y+z=2. In some embodiments, x has a value having the range 0<x≤0.2 or 0.02≤x≤0.2.

In some embodiments, the inorganic scintillator has the formula:

$$Sr_yBa_zCsI_5:Ln^1_x \quad \text{(IIb)};$$

wherein $Ln^1$ is a lanthanide with a valence of 2+; x has a value having the range 0<x<2; y has a value having the range 0≤y<2; z has a value having the range 0≤z<2; x+y+z=2; and, y+z>0.

In some embodiments, the inorganic scintillator has the formula:

$$Sr_yBa_zCsCl_5:Ln^1_x \quad \text{(IIc)};$$

wherein $Ln^1$ is a lanthanide with a valence of 2+; x has a value having the range 0<x<2; y has a value having the range 0≤y<2; z has a value having the range 0≤z<2; x+y+z=2; and, y+z>0.

In some embodiments, the inorganic scintillator has the formula:

$$Sr_yBa_zCsBr_5:Ln^1_x \quad \text{(IId)};$$

wherein $Ln^1$ is a lanthanide with a valence of 2+; x has a value having the range 0<x<2; y has a value having the range 0≤y<2; z has a value having the range 0≤z<2; x+y+z=2; and, y+z>0.

In some embodiments, the inorganic scintillator has the formula:

$$M_mCsX_5:Ln^1_X \quad \text{(IIe)};$$

wherein M is Sr or Ba; X is Br, Cl, I, or a mixture thereof; Ln' is a lanthanide with a valence of 2+; x has a value having the range 0<x<2; m has a value having the range 0<m<2; and, x+m=2. In some embodiments, x has a value having the range 0<x≤0.2 or 0.02≤x≤0.2.

In some embodiments, the inorganic scintillator has the formula:

$$M_mCsI_5:Ln^1_x \quad \text{(IIf)};$$

wherein M is Sr or Ba; $Ln^l$ is a lanthanide with a valence of 2+; x has a value having the range 0<x<2; m has a value having the range 0<m<2; and, x+m=2.

In some embodiments, the inorganic scintillator has the formula:

$$M_mCsCl_5:Ln^1_x \quad \text{(IIg)};$$

wherein M is Sr or Ba; $Ln^1$ is a lanthanide with a valence of 2+; x has a value having the range 0<x<2; m has a value having the range 0<m<2; and, x+m=2.

In some embodiments, the inorganic scintillator has the formula:

$$M_mCsBr_5:Ln^1_x \quad \text{(IIh)};$$

wherein M is Sr or Ba; $Ln^1$ is a lanthanide with a valence of 2+; x has a value having the range 0<x<2; m has a value having the range 0<m<2; and, x+m=2.

In some embodiments, the inorganic scintillator has the formula:

$$Sr_bBa_cCs_{1+a}X_5:Ln^2_a \quad \text{(VIIIa)};$$

wherein X is Br, Cl, I, or a mixture thereof; $Ln^2$ is a lanthanide with a valence of 3+; a has a value having the range 0<a<1; b has a value having the range 0≤b<2; c has a value having the range 0≤c<2; 2a+b+c=2; b+c>0; and, with the proviso that $Ln^2$ is not Ce or Pr.

In some embodiments, the inorganic scintillator has the formula:

$$Sr_bBa_cCs_{1+a}I_5:Ln^2_a \quad \text{(VIIIb)};$$

wherein $Ln^2$ is a lanthanide with a valence of 3+; a has a value having the range 0≤a<1; b has a value having the range 0≤b<2; c has a value having the range 0≤c<2; 2a+b+c=2; b+c>0; and, with the proviso that $Ln^2$ is not Ce or Pr.

In some embodiments, the inorganic scintillator has the formula:

$$Sr_bBa_cCs_{1+a}Cl_5:Ln^2_a \quad \text{(VIIIc)};$$

wherein $Ln^2$ is a lanthanide with a valence of 3+; a has a value having the range 0<a<1; b has a value having the range 0≤b<2; c has a value having the range 0≤c<2; 2a+b+c=2; b+c>0; and, with the proviso that $Ln^2$ is not Ce or Pr.

In some embodiments, the inorganic scintillator has the formula:

$$Sr_bBa_cCs_{1+a}Br_5:Ln^2_a \quad \text{(VIIId)};$$

wherein $Ln^2$ is a lanthanide with a valence of 3+; a has a value having the range 0<a<1; b has a value having the range 0≤b<2; c has a value having the range 0≤c<2; 2a+b+c=2; b+c>0; and, with the proviso that $Ln^2$ is not Ce or Pr.

In some embodiments, the inorganic scintillator has the formula:

$$M_nCs_{1+a}X_5:Ln^2_a \quad (VIIIe)$$

wherein M is Sr or Ba; X is Br, Cl, I, or a mixture thereof; $Ln^2$ is a lanthanide with a valence of 3+; a has a value having the range $0<a<1$; n has a value having the range $0<n<2$; $2a+n=2$; and, with the proviso that $Ln^2$ is not Ce or Pr.

In some embodiments, the inorganic scintillator has the formula:

$$M_nCs_{1+a}I_5:Ln^2_a \quad (VIIIf)$$

wherein M is Sr or Ba; $Ln^2$ is a lanthanide with a valence of 3+; a has a value having the range $0<a<1$; n has a value having the range $0<n<2$; $2a+n=2$; and, with the proviso that $Ln^2$ is not Ce or Pr.

In some embodiments, the inorganic scintillator has the formula:

$$M_nCs_{1+a}Cl_5:Ln^2_a \quad (VIIIg)$$

wherein M is Sr or Ba; $Ln^2$ is a lanthanide with a valence of 3+; a has a value having the range $0<a<1$; n has a value having the range $0<n<2$; $2a+n=2$; and, with the proviso that $Ln^2$ is not Ce or Pr.

In some embodiments, the inorganic scintillator has the formula:

$$M_nCs_{1+a}Br_5:Ln^2_a \quad (VIIIh)$$

wherein M is Sr or Ba; $Ln^2$ is a lanthanide with a valence of 3+; a has a value having the range $0<a<1$; n has a value having the range $0<n<2$; $2a+n=2$; and, with the proviso that $Ln^2$ is not Ce or Pr.

In some embodiments, the inorganic scintillator has the formula:

$$Cs_xM_{1-z}X_y:Ln^1_z \quad (Ia)$$

wherein M is an alkaline earth metal; X is Br, Cl, I, or a mixture thereof; $Ln^1$ is a lanthanide with a valence of 2+; x is 1, 2, or 4; when x is 1 then y is 3; when x is 2 then y is 4; when x is 4 then y is 6; and, z has a value having the range $0<z<1$. In some embodiments of the invention, M is Sr or Ba. In some embodiments of the invention, $Ln^1$ is Eu.

In some embodiments, the inorganic scintillator has the formula:

$$Cs_xSr_{1-z}X_y:Ln^1_z \quad (Ib)$$

wherein X is Br, Cl, I, or a mixture thereof; $Ln^1$ is a lanthanide with a valence of 2+; x is 1, 2, or 4; when x is 1 then y is 3; when x is 2 then y is 4; when x is 4 then y is 6; and, z has a value having the range $0<z<1$. In some embodiments of the invention, $Ln^1$ is Eu.

In some embodiments, the inorganic scintillator has the formula:

$$Cs_xBa_{1-z}X_y:Ln^1_z \quad (Ic)$$

wherein X is Br, Cl, I, or a mixture thereof; $Ln^1$ is a lanthanide with a valence of 2+; x is 1, 2, or 4; when x is 1 then y is 3; when x is 2 then y is 4; when x is 4 then y is 6; and, z has a value having the range $0<z<1$. In some embodiments of the invention, $Ln^1$ is Eu.

In some embodiments, the inorganic scintillator has the formula:

$$CsM_{1-z}X_3:Ln^1_z \quad (IIIa)$$

wherein M is an alkaline earth metal; X is Br, Cl, I, or a mixture thereof; $Ln^1$ is a lanthanide with a valence of 2+; and, z has a value having the range $0<z<1$. In some embodiments of the invention, M is Sr or Ba. In some embodiments of the invention, $Ln^1$ is Eu.

In some embodiments, the inorganic scintillator has the formula:

$$CsSr_{1-z}X_3:Ln^1_z \quad (IIIb)$$

wherein X is Br, Cl, I, or a mixture thereof; $Ln^1$ is a lanthanide with a valence of 2+; and, z has a value having the range $0<z<1$. In some embodiments of the invention, $Ln^1$ is Eu.

In some embodiments, the inorganic scintillator has the formula:

$$CsBa_{1-z}X_3:Ln^1_z \quad (IIIc)$$

wherein X is Br, Cl, I, or a mixture thereof; $Ln^1$ is a lanthanide with a valence of 2+; and, z has a value having the range $0<z<1$. In some embodiments of the invention, $Ln^1$ is Eu.

In some embodiments, the inorganic scintillator has the formula:

$$Cs_2M_{1-z}X_4:Ln^1_z \quad (IVa)$$

wherein M is an alkaline earth metal; X is Br, Cl, I, or a mixture thereof; $Ln^1$ is a lanthanide with a valence of 2+; and, z has a value having the range $0<z<1$. In some embodiments of the invention, M is Sr or Ba. In some embodiments of the invention, $Ln^1$ is Eu.

In some embodiments, the inorganic scintillator has the formula:

$$Cs_2Sr_{1-z}X_4:Ln^1_z \quad (IVb)$$

wherein X is Br, Cl, I, or a mixture thereof; $Ln^1$ is a lanthanide with a valence of 2+; and, z has a value having the range $0<z<1$. In some embodiments of the invention, $Ln^1$ is Eu.

In some embodiments, the inorganic scintillator has the formula:

$$Cs_2Ba_{1-z}X_4:Ln^1_z \quad (IVc)$$

wherein X is Br, Cl, I, or a mixture thereof; $Ln^1$ is a lanthanide with a valence of 2+; and, z has a value having the range $0<z<1$. In some embodiments of the invention, $Ln^1$ is Eu.

In some embodiments, the inorganic scintillator has the formula:

$$Cs_4M_{1-z}X_6:Ln^1_z \quad (Va)$$

wherein M is an alkaline earth metal; X is Br, Cl, I, or a mixture thereof; $Ln^1$ is a lanthanide with a valence of 2+; and, z has a value having the range $0<z<1$. In some embodiments of the invention, M is Sr or Ba. In some embodiments of the invention, $Ln^1$ is Eu.

In some embodiments, the inorganic scintillator has the formula:

$$Cs_4Sr_{1-z}X_6:Ln^1_z \quad (Vb)$$

wherein X is Br, Cl, I, or a mixture thereof; $Ln^1$ is a lanthanide with a valence of 2+; and, z has a value having the range $0<z<1$. In some embodiments of the invention, $Ln^1$ is Eu.

In some embodiments, the inorganic scintillator has the formula:

$$Cs_4Ba_{1-z}X_6:Ln^1_z \quad (Vc)$$

wherein X is Br, Cl, I, or a mixture thereof; $Ln^1$ is a lanthanide with a valence of 2+; and, z has a value having the range 0<z<1. In some embodiments of the invention, $Ln^1$ is Eu.

In some embodiments, the inorganic scintillator has the formula:

$$Sr_{1-y'-y}Ba_{y}X^1{}_xX^2{}_{2-x}{:}Ln^1{}_{y'} \quad (VIa);$$

wherein $X^1$ is a first halogen element, $X^2$ is a second halogen element, $X^1$ and $X^2$ are not the same halogen element, $Ln^1$ is a lanthanide with a valence of 2+, x has a value having the range 0<x≤2, y' has a value having the range 0≤y'<1, y has a value having the range 0<y≤1, and y'+y<1.

In some embodiments, the inorganic scintillator has the formula:

$$Ba_{1-y}X^1{}_xX^2{}_{2-x}{:}Ln^1{}_y \quad (VIb);$$

wherein $X^1$ is a first halogen element, $X^2$ is a second halogen element, $X^1$ and $X^2$ are not the same halogen element, Ln is a lanthanide with a valence of 2+, x has a value having the range 0<x<2, and y has a value having the range 0<y≤1, and the inorganic scintillator is a single crystal having at least one dimension of a length of at least 1 mm, at least 5 mm, at least 1 cm, or at least 3 cm, or a length at least sufficient to stop or absorb gamma-radiation.

In some embodiments, the inorganic scintillator has the formula:

$$Ba_{1-y}X^1{}_xX^2{}_{2-x}{:}Ln^1{}_y \quad (VIc);$$

wherein $X^1$ is a first halogen element, $X^2$ is a second halogen element, $X^1$ and $X^2$ are not the same halogen element, Ln is a lanthanide with a valence of 2+, x has a value having the range 0<x<2, and y has a value having the range 0<y<1; with the proviso that the inorganic scintillator is not BaFCl:$Eu^{2+}$, BaFBr:$Eu^{2+}$, BaFI:$Eu^{2+}$, BaBrCl:$Eu^{2+}$, BaClI:$Eu^{2+}$, BaBrI:$Eu^{2+}$, EuFCl, EuFBr, and/or EuFI.

In some embodiments, the inorganic scintillator has the formula:

$$Ba_{1-y}X^1{}_xX^2{}_{2-x}{:}Ln^1{}_y \quad (VId);$$

wherein $X^1$ is a first halogen element, $X^2$ is a second halogen element, $X^1$ and $X^2$ are not the same halogen element, Ln is a lanthanide with a valence of 2+ and it is not $Eu^{2+}$, x has a value having the range 0<x<2, and y has a value having the range 0<y≤1.

In some embodiments, the inorganic scintillator has the formula:

$$Ba_{1-y}X^1{}_xX^2{}_{2-x}{:}Ln^1{}_y \quad (VIe);$$

wherein $X^1$ is a first halogen element, $X^2$ is a second halogen element, $X^1$ and $X^2$ are not the same halogen element, Ln is a lanthanide with a valence of 2+, x has a value having the range 0<x<2, and y has a value having the range 0<y≤1.

In some embodiments, the inorganic scintillator has the formula:

$$Ba_{1-y}X^1{}_xX^2{}_{2-x}{:}Ln^1{}_y \quad (VIf);$$

wherein $X^1$ is Cl, Br, or I, $X^2$ is Cl, Br, or I, $X^1$ and $X^2$ are not the same halogen element, Ln is a lanthanide with a valence of 2+ (such as $Eu^{2+}$), x has a value having the range 0<x<2, and y has a value having the range 0<y≤1.

In some embodiments of the invention, the mixed halide combination is: (i) $X^1$ is Cl and $X^2$ is Br; (ii) $X^1$ is Cl and $X^2$ is I; or, (iii) $X^1$ is Br and $X^2$ is I.

In some embodiments, the inorganic scintillator has the formula:

$$Ba_{1-y}F_xX_{2-x}{:}Ln^1{}_y \quad (VIg);$$

wherein X is Cl, Br, or I, Ln is a lanthanide with a valence of 2+ (such as $Eu^{2+}$), x has a value having the range 0<x<2, and y has a value having the range 0<y≤1.

The inorganic scintillator can be in a polycrystalline powder or a single crystal form. The crystal can be any size with an average volume of at least 0.001 $mm^3$, at least 1 $mm^3$, at least 5 $mm^3$, at least 10 $mm^3$, at least 100 $mm^3$, at least 3 $cm^3$, at least 1 $cm^3$, or at least 10 $cm^3$. The crystal can be any size with at least one dimension of the crystal having a length of at least 100 μm, at least 1 mm, at least 2 mm, at least 5 mm, at least 1 cm, at least 3 cm, at least 5 cm, or at least 10 cm. In some embodiments of the invention, the crystal has at least one dimension having a length that is of sufficient length, or depth, to stop or absorb gamma-radiation in order to electronically detect the gamma-radiation.

The lanthanide atoms in the inorganic scintillator substitute for the strontium atoms and/or barium atoms and optionally the cesium atoms.

The inorganic scintillators of the present invention are useful as they are scintillators and they produce a useful bright and fast scintillation in response to irradiation by short-wavelength high energy light, such as x-ray or gamma rays. The crystals of the inorganic scintillator also have the added advantage of having the property of readily growing into crystals. Large size crystals can be grown by the following technique: Bridgman growth and related techniques, Czochralski growth and related techniques, the traveling heater method and related techniques.

Characterization of the Inorganic Scintillators

The crystals of the invention can be characterized using a variety of methods. The crystals can be characterized regarding X-ray diffractometry, X-ray luminescence spectra, X-ray fluorescence for concentration of activators, and/or pulsed X-ray time response. X-ray diffractometry determines the composition of crystalline solids, such as crystalline phase identification. X-ray luminescence spectra determines the spectra components. Pulsed X-ray time response determines luminosity, decay times, and fractions. X-ray luminescence is used to determine the relative luminosity of a crystal. An X-ray excited emission spectra is obtained of a crystal by irradiating the crystal with an X-ray and collecting the emission light, such as at 90°, by a CCD detector.

In some embodiments of the invention, the luminosity of the inorganic scintillator is more than the luminosity of yttrium aluminum perovskite (YAP) and/or bismuth germanate (BGO). In further embodiments of the invention, the luminosity of the inorganic scintillators is more than double the luminosity of YAP and/or BGO.

In some embodiments of the invention, the single crystal inorganic scintillators, such as $Ba_2CsI_5$:2% Eu, have a luminescence output equal to or more than 60,000 photons/MeV, and a decay of equal to or more than 85% of the emitted light in a period equal to or less than 1.2 μs.

In some embodiments of the invention, the single crystal inorganic scintillators, such as $Ba_2CsI_5$:7% Eu, has a decay of equal to or more than 80% of the emitted light in a period equal to or less than 1.2 μs.

In some embodiments of the invention, the single crystal inorganic scintillators, such as $Sr_2CsI_5$:2% Eu, has a decay of equal to or more than 70% of the emitted light in a period equal to or less than 1.2 μs.

Figure 11:
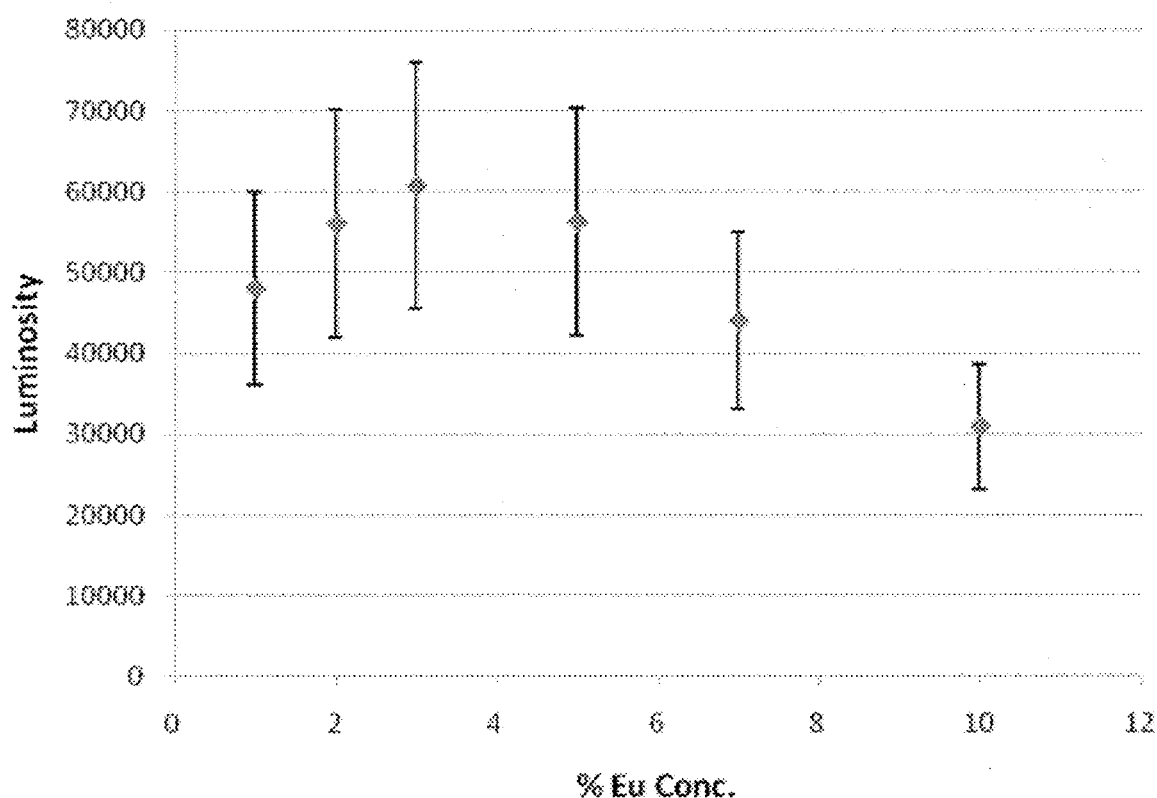
FIG. 11 shows the measured luminescence intensity of $Sr_2CsI_5$:Eu crystals for different molar percent concentrations of Eu.

In some embodiments of the invention, the single crystal inorganic scintillators, such as $Sr_2CsI_5$:1-10% Eu, has a X-ray excited luminescence equal to or more than the luminosity shown in FIG. 11.

In some embodiments of the invention, the crystal inorganic scintillators, such as $Cs_2BaC_4$:Eu, $Cs_2BaBr_4$:Eu, and Cs$_2$BaI$_4$:Eu (having from over 0% to 10% Eu), have a luminescence output equal to or more than 30,000 photons/ MeV, and a decay of equal to or more than 50% of the emitted light in a period equal to or less than 1 µs.

In some embodiments of the invention, the crystal inorganic scintillators, such as CsSrBr$_3$:1% Eu, CsSrBr$_3$:3% Eu, and CsSrBr$_{3.5}$% Eu, have a luminescence output equal to or more than 10,000, 20,000, or 40,000 photons/MeV, and a decay of equal to or more than 50% of the emitted light in a period equal to or less than 1 µs.

In some embodiments of the invention, the inorganic scintillator crystals which contain fluorine are not sensitive to moisture and can be handled and stored under ambient conditions. The inorganic scintillator crystals which do not contain fluorine are less sensitive to moisture than SrI$_2$:Eu.

In some embodiments of the invention, the single crystal inorganic scintillators, such as BaFI:Eu, which contain fluorine, have a luminescence output of about 30,000, 40,000, or 50,000 photons/MeV, and a decay of about 99% in less than 1 µs.

In some embodiments of the invention, the single crystal inorganic scintillators, such as BaBrI:Eu, which do not contain fluorine, have a luminescence output of at least 75,000 photons/MeV, and a decay of about 98% in less than 700 ns or 1 µs.

Preparation of the Inorganic Scintillators

The inorganic scintillators of the invention can be prepared using a variety of methods. For example, the crystals useful for fabrication of luminescent screens can be prepared by a solid-state reaction aided, or optionally not aided, by a flux of halides as described herein. In some embodiments, the single crystals are prepared by providing a composition comprising essentially of a mixture of halide salts useful for producing the inorganic scintillator as described herein. The mixture is heated to a temperature of up to about 550-900° C. using a simple programmable furnace to produce a reactive molten mixture. The reaction is maintained at temperature for the mixture to fully react and produce the desired melt. The resultant molten product of reaction is then cooled slowly at about 2 to 5° C./minute.

A particular method of preparing the inorganic scintillator of the invention is as follows: Bridgman growth and related techniques, Czochralski growth and related techniques, the traveling heater method and related techniques. These methods can be used to produce the inorganic scintillator as single crystals on a one-by-one basis.

The Bridgman growth technique is a directional solidification process. The technique involves using an ampoule containing a melt which moves through an axial temperature gradient in a furnace. Single crystals can be grown using either seeded or unseeded ampoules. The Bridgman growth technique is taught in Robertson J. M., 1986, Crystal growth of ceramics: Bridgman-Stockbarger method in Bever: 1986 "Encyclopedia of Materials Science and Engineering" Pergamon, Oxford pp. 963-964, which is incorporated by reference.

The Czochralski growth technique comprises a process of obtaining single-crystals in which a single crystal material is pulled out of the melt in which a single-crystal seed is immersed and then slowly withdrawn; desired optical properties and doping level is accomplished by adding dopants to the melt. The Czochralski growth technique is taught in J. Czochralski, "Ein neues Verfahren zur Messung der Kristallisationsgeschwindigheit der Metalle" [A new method for the measurement of the crystallization rate of metals], Z. Phys. Chemie 92 (1918) 219-221, which is incorporated by reference. The method is well-know to those skilled in the art in producing a wide variety of compounds, including semiconductors and scintillator materials (such as LaBr$_3$: Ce).

The traveling heater method is described in Triboulet, Prog. Cryst. Gr. Char. Mater., 128, 85 (1994) and Funaki et al., Nucl. Instr. And Methods, A 436 (1999), which are incorporated in their entireties by reference.

A particular method of preparing inorganic scintillators of the invention is the ceramic method which comprises the following steps: The reactant mixture is placed in a container, such as a glove box, filled with one or more inert gas, such as nitrogen gas. The container is under a very dry condition. The dry condition is required due to the hygroscopic nature of the halides within the reactant mixture. The two or more powder reactants are ground together, such as with a mortar and pestle, for a sufficient period, such as about 10 minutes, to produce a reactant mixture. When Ln halide salt is added to the powder reactants for grinding, a suitable organic solvent or solution can be further added, and grinding can take place until the mixture appears dry. The reactant mixture is sintered under high temperature and pressure.

In some embodiment of the invention, the single crystals of the inorganic scintillator can be grown by melting and re-solidifying the pre-synthesized compounds in powder form, such as described herein, or directly from melting the mixtures of the halides salts and lanthanide halides used as activators. To grow best performing crystals the starting compounds might need to be purified further by zone refining.

Growing the single crystal involves loading the mixtures, such as described herein, in a quartz ampoule in a dry environment and sealing the ampoule using a high temperature torch, maintaining the dry environment at a reduced pressure, in the ampoule. The ampoule is then placed in a furnace. The growth of the crystal can be performed by a variation of the known vertical "Bridgman" technique. The compound is melted, let to homogenized at a temperature above the melting point and the compound is solidified in a directional manner in a temperature gradient. The ampoule is shaped to provide a nucleation site at the bottom (conical shape). The solidification front moves upward. Horizontal configurations and other growth techniques such as Czochralski (may need to pressurized the growth chamber) could be used.

In some embodiments of the invention, the method for producing the composition comprising the inorganic scintillator of the present invention comprises: (a) providing a sealed container containing the composition comprising essentially of a mixture of halide salts useful for producing the inorganic scintillator of the present invention, (b) heating the container sufficiently to produce a melted mixture, and (c) solidying or growing a crystal from the melted mixture, such that the composition comprising the inorganic scintillator of the present invention is produced.

In some embodiments of the invention, the method for producing the composition comprising the inorganic scintillator of the present invention comprises: (a) providing the composition comprising essentially of a mixture of halide salts, (b) loading the halide salts in a suitable container, (c) sealing the container, (d) heating the container sufficiently to produce a melted mixture, and (e) solidying or growing a crystal from the melted mixture, such that the composition comprising the inorganic scintillator of the present invention is produced.

In some embodiments, the container is a quartz container. In some embodiments, the sealed container is an ampoule. In some embodiments, the heating takes place in a furnace. The mixture is heated to a suitable temperature to melt the halides in the mixture. One skilled in the art can easily determine a temperature or a range of temperatures suitable for melting the mixture of halides. For example, for producing $Ba_2CsI_5$:Eu, a temperature of about 650-750° C. is suitable. For example: for producing $Cs_2BaCl_4$:Eu, a temperature of about 600-850° C. is suitable. For producing $Cs_2BaBr_4$:Eu, a temperature of about 860° C. is suitable. For producing $Cs_2BaI_4$:Eu, a temperature of about 650-740° C. is suitable. For producing $Cs_2BaBr_4$:Eu, a temperature of about 600° C.-860° C. is suitable. For producing $Cs_2BaI_4$:Eu, a temperature of about 550-740° C. is suitable. The furnace can be a Bridgman-type or float-zone-type (mirror-furnace where heat s supplied by halogen lamps, or induction heated furnace). When using a Bridgman configuration, the crystal is solidified from the melt directionally. When using the float-zone configuration, the crystal is solidified from a narrow molten zone of a pre-reacted charge. In both cases the growth rate of the crystal can be within a thermal gradient across the solid/liquid interface. The ratio of gradient to growth rate determines the stability of the interface. The growth rate can be decreased if the thermal gradient is increased. Typical thermal gradient can be more than 1° C./cm. Once all solidified, the crystal is cooled slowly. The cooling rate can be in the range from less than 1° C./hr to more than 20° C./hr.

The resulting crystals are then characterized by the methods described herein. The resulting crystals also have properties similar to those described herein.

Application of the Inorganic Scintillators

The present invention provides for a gamma ray or x-ray detector, comprising: a scintillator composed of a transparent single crystal of the inorganic scintillator of the present invention, and a photodetector optically coupled to the scintillator for producing an electrical signal in response to the emission of a light pulse by the scintillator.

The inorganic scintillators of this invention have many advantages over other known crystals. The inorganic scintillators produce a luminescence in response irradiation, such as irradiation by alpha-, beta-, or gamma-radiation, which is brighter and faster than known and commercially used scintillators. The scintillating crystals have a number of applications as detectors, such as in the detection of gamma-ray, which has use in national security, such as for detection of nuclear materials, and medical imaging applications.

The invention is useful for the detection of ionizing radiation. Applications include medical imaging, nuclear physics, nondestructive evaluation, treaty verification and safeguards, environmental monitoring, and geological exploration. This will be a major improvement, providing much finer resolution, higher maximum event rates, and clearer images.

Also, activated inorganic scintillator crystals of the present invention can be useful in positron emission tomography (PET).

The invention also relates to the use of the scintillating material above as a component of a detector for detecting radiation in particular by gamma rays and/or X-rays. Such a detector especially comprises a photodetector optically coupled to the scintillator in order to produce an electrical signal in response to the emission of a light pulse produced by the scintillator. The photodetector of the detector may in particular be a photomultiplier, photodiode, or CCD sensor.

A particular use of this type of detector relates to the measurement of gamma or x-ray radiation, such a system is also capable of detecting alpha and beta radiation and electrons. The invention also relates to the use of the above detector in nuclear medicine apparatuses, especially gamma cameras of the Anger type and positron emission tomography scanners (see, for example C. W. E. Van Eijk, "Inorganic Scintillator for Medical Imaging", International Seminar New types of Detectors, 15 19 May 1995—Archamp, France. Published in "Physica Medica", Vol. XII, supplement 1, June 1996; hereby incorporated by reference).

In another particular use, the invention relates to the use of the above detector in detection apparatuses for oil drilling (see, for example "Applications of scintillation counting and analysis", in "Photomultiplier tube, principle and application", chapter 7, Philips; hereby incorporated by reference).

Figure 4:
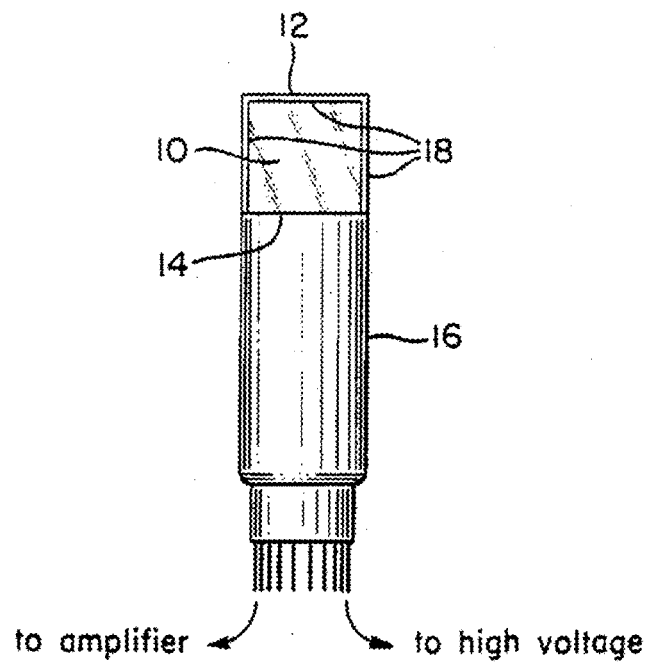
FIG. 4 is a diagrammatic view of one embodiment of a scintillation detector in accordance with the present invention.

One embodiment of the invention is shown in FIG. 4 which shows a gamma ray detector. The detector can be one as described in U.S. Pat. No. 4,958,080, hereby incorporated by reference. It will be understood, of course, that the utility of the novel single crystal inorganic scintillator of the invention is not limited to the detection of gamma radiation but that it has general application to the detection of other types of like radiation, e.g. X-rays, cosmic rays, and energetic particles.

In FIG. 4, a single crystal inorganic scintillator 10 is shown encased within the housing 12 of a gamma ray detector. One face 14 of the scintillator is placed in optical contact with the photosensitive surface of a photomultiplier tube 16. Alternatively, the light pulses could be coupled to the photomultiplier via light guides or fibers, lenses, mirrors, or the like. The photomultiplier can be replaced by any suitable photodetector such as a photodiode, microchannel plate, etc. In order to direct as much of each light flash to the photomultiplier as possible, the other faces 18 of the inorganic scintillator are preferably surrounded or covered with a reflective material, e.g. Teflon tape, magnesium oxide powder, aluminum foil, or titanium dioxide paint. Light pulses emitted by the crystal inorganic scintillator upon the incidence of radiation are intercepted, either directly or upon reflection from the surfaces 18, by the photomultiplier, which generates electrical pulses or signals in response to the light pulses. These electrical output pulses are typically first amplified and then subsequently processed as desired, e.g. in a pulse height amplifier, to obtain the parameters of interest regarding the detected radiation. The photomultiplier is also connected to a high voltage power supply, as indicated in FIG. 4. Other than the inorganic scintillator, all of the components and materials referred to in connection with FIG. 4 are conventional, and thus need not be described in detail.

It is to be understood that, while the invention has been described in conjunction with the preferred specific embodiments thereof, the foregoing description is intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

The invention having been described, the following examples are offered to illustrate the subject invention by way of illustration, not by way of limitation.

EXAMPLE 1

Characterization of $Ba_2CsI_5$:2% Eu

Figure 2:
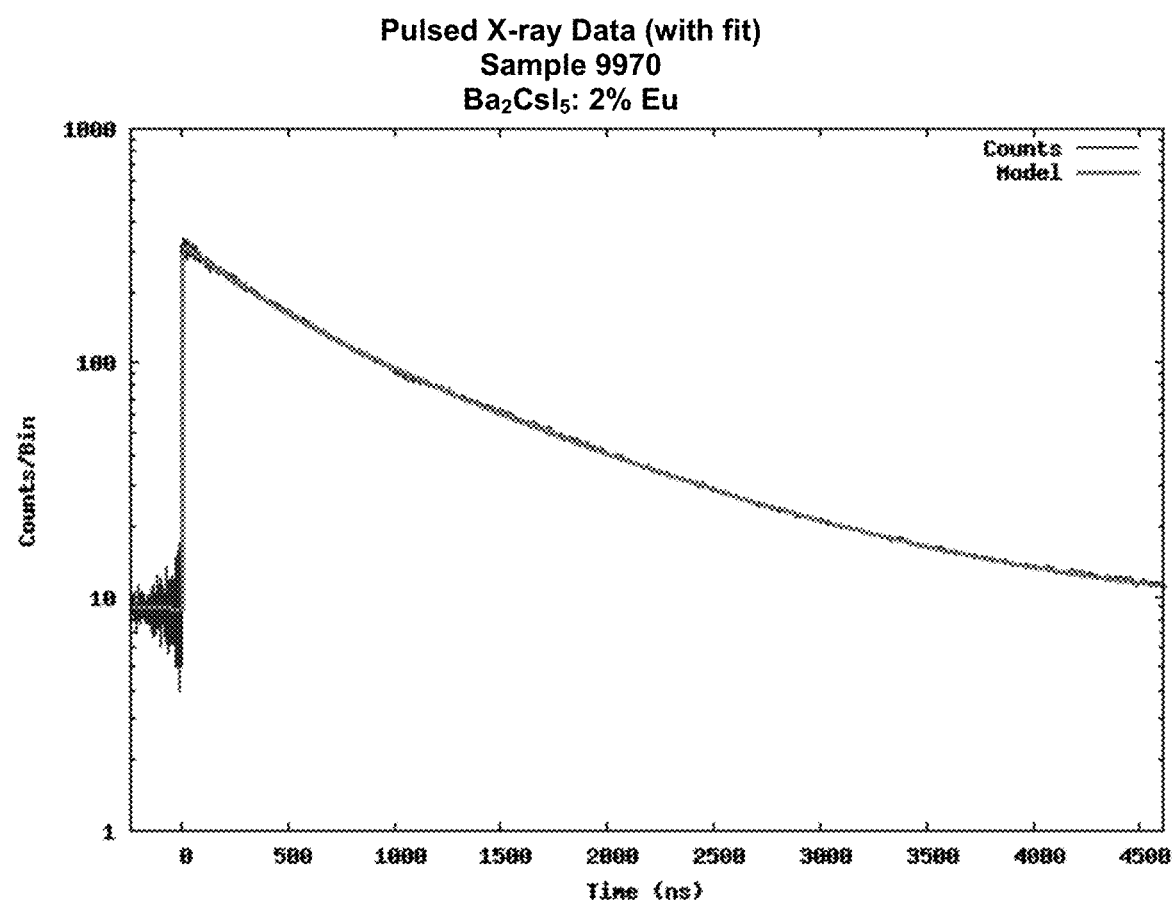
FIG. 2 shows the pulsed x-ray measurement of $Ba_2CsI_5$: 2% Eu showing a decay time for 85% of the emitted light of less than 1.2 µs.
Figure 3:
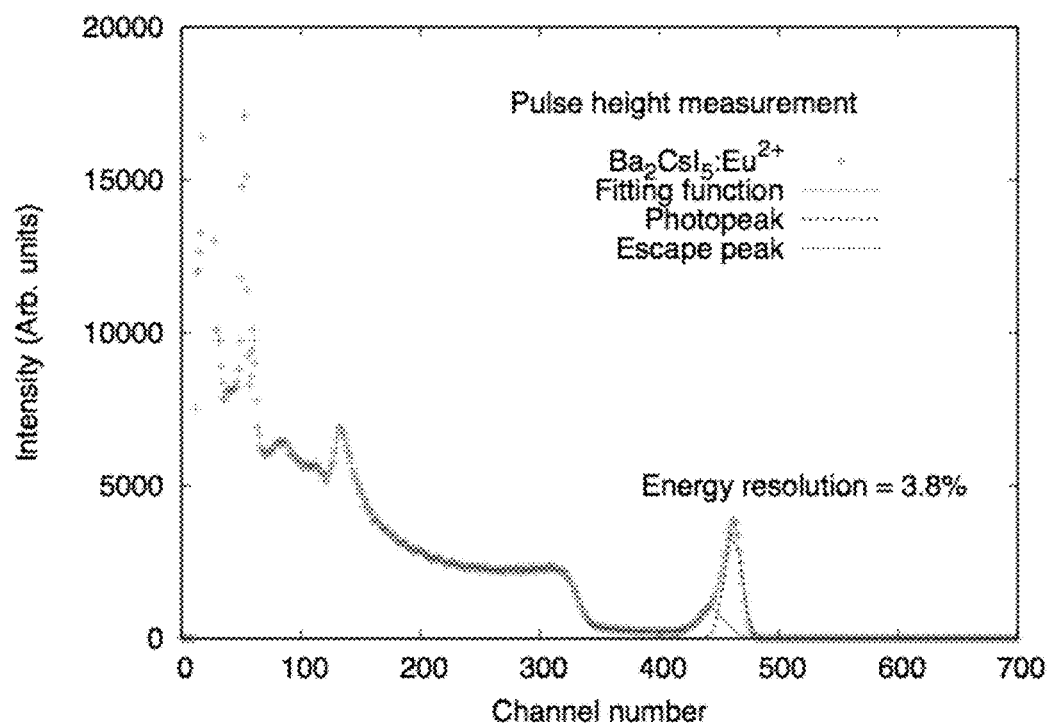
FIG. 3 shows the response of a $Ba_2CsI_5$:2% Eu crystal to gamma irradiation showing an energy resolution of 3.8% at 662 keV.

Powders of the composition $Ba_2CsI5$:2% Eu are obtained by a solid state route using commercial chemicals without further purification. The compound was subsequently grown as a single crystal using the Bridgman technique. FIG. 1 shows the emission spectrum of a $Ba_2CsI_5$:2% Eu crystal under x-ray excitation. The emission maximum is at ~430 nm. The compound is particularly bright with a luminosity of more than 60,000 ph/MeV and a very good energy resolution of less than 4%. FIG. 2 shows the pulsed x-ray measurement showing a decay time for 85% of the emitted light of less than 1.2 μs. FIG. 3 shows the response of a $Ba_2CsI_5$:2% Eu crystal to gamma irradiation showing an energy resolution of 3.8% at 662 keV.

These inorganic scintillator crystals are useful for national security purposes, such as detecting nuclear material.

EXAMPLE 2

Characterization of $Ba_2CsI_5$:7% Eu

Figure 6:
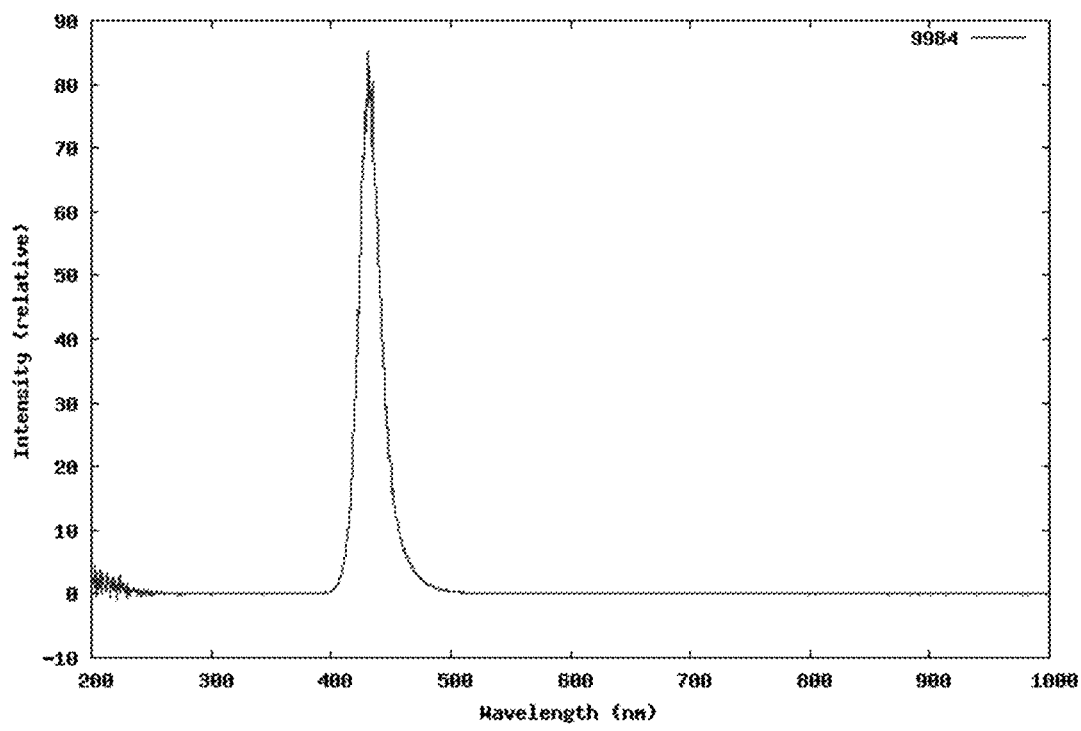
FIG. 6 shows the emission spectrum of a $Ba_2CsI_5$:7% Eu crystal under x-ray excitation.
Figure 7:
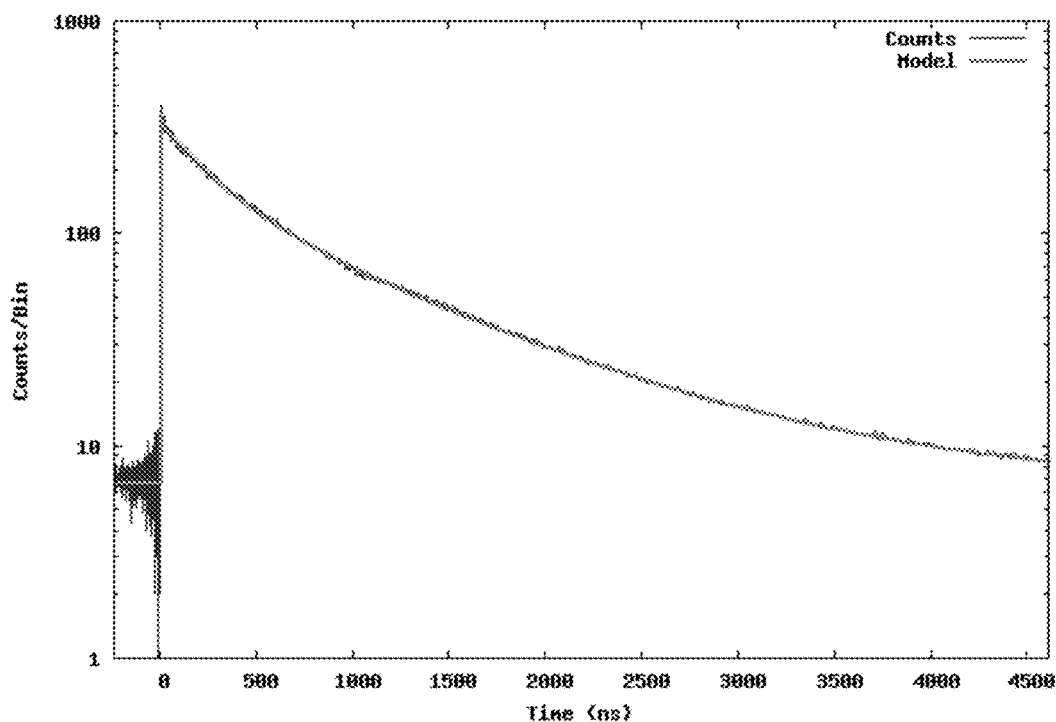
FIG. 7 shows the pulsed x-ray measurement of $Ba_2CsI_5$: 7% Eu showing a decay time for more than 80% of the emitted light of less than 1.2 µs.
Figure 8:
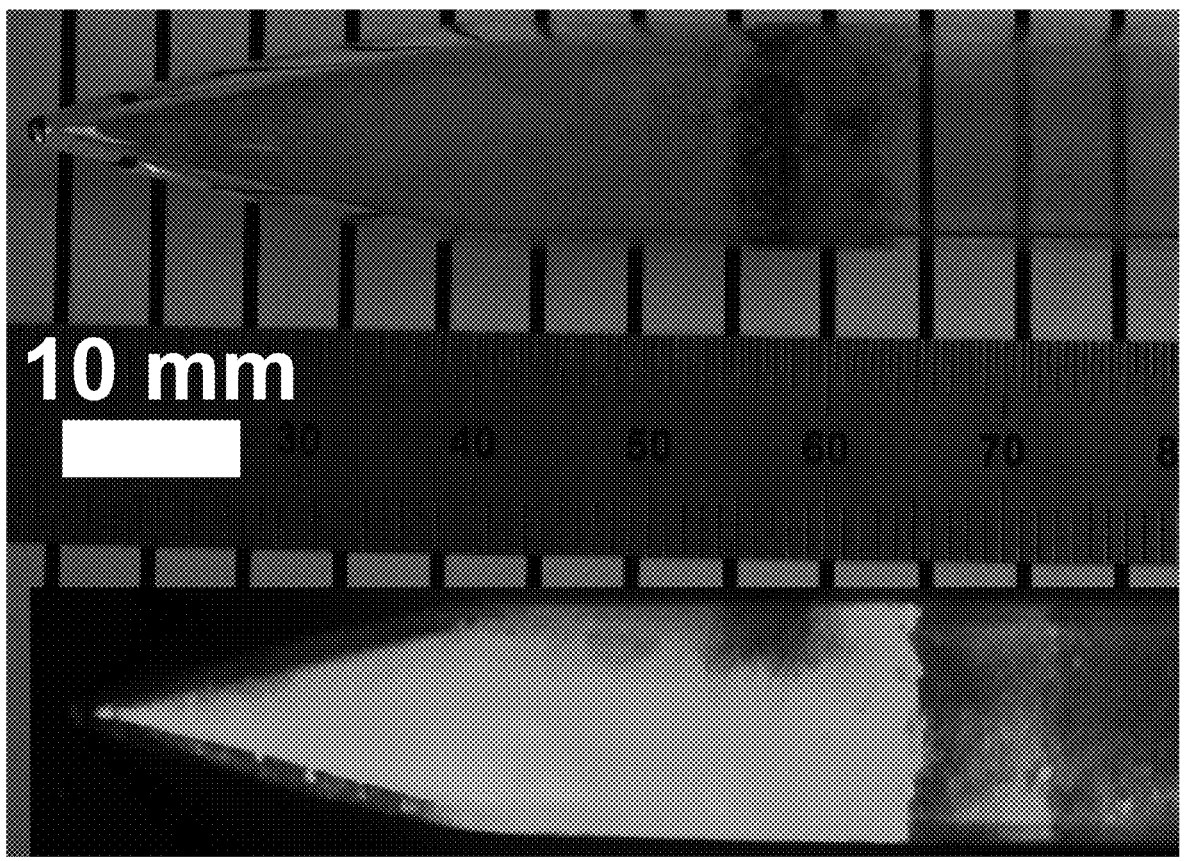
FIG. 8 shows an image of a $Ba_2CsI_5$:Eu crystal in the ampoule as-grown (top) and in the ampoule as viewed scintillating under UV illumination (bottom). The white bar shows the scale.

Powders of the composition $Ba_2CsI_5$:7% Eu are obtained by a solid state route using commercial chemicals without further purification. The compound was subsequently grown as a single crystal using the Bridgman technique. FIG. 6 shows the emission spectrum of a $Ba_2CsI_5$:7% Eu crystal under x-ray excitation. The emission maximum is at ~430 nm. FIG. 7 shows the pulsed x-ray measurement showing a decay time for more than 80% of the emitted light of less than 1.2 μs.

These inorganic scintillator crystals are useful for national security purposes, such as detecting nuclear material.

EXAMPLE 3

Luminescence intensity of $Ba_2CsI_5$: Eu crystals with concentrations ranging from 1% to 10%

Figure 5:
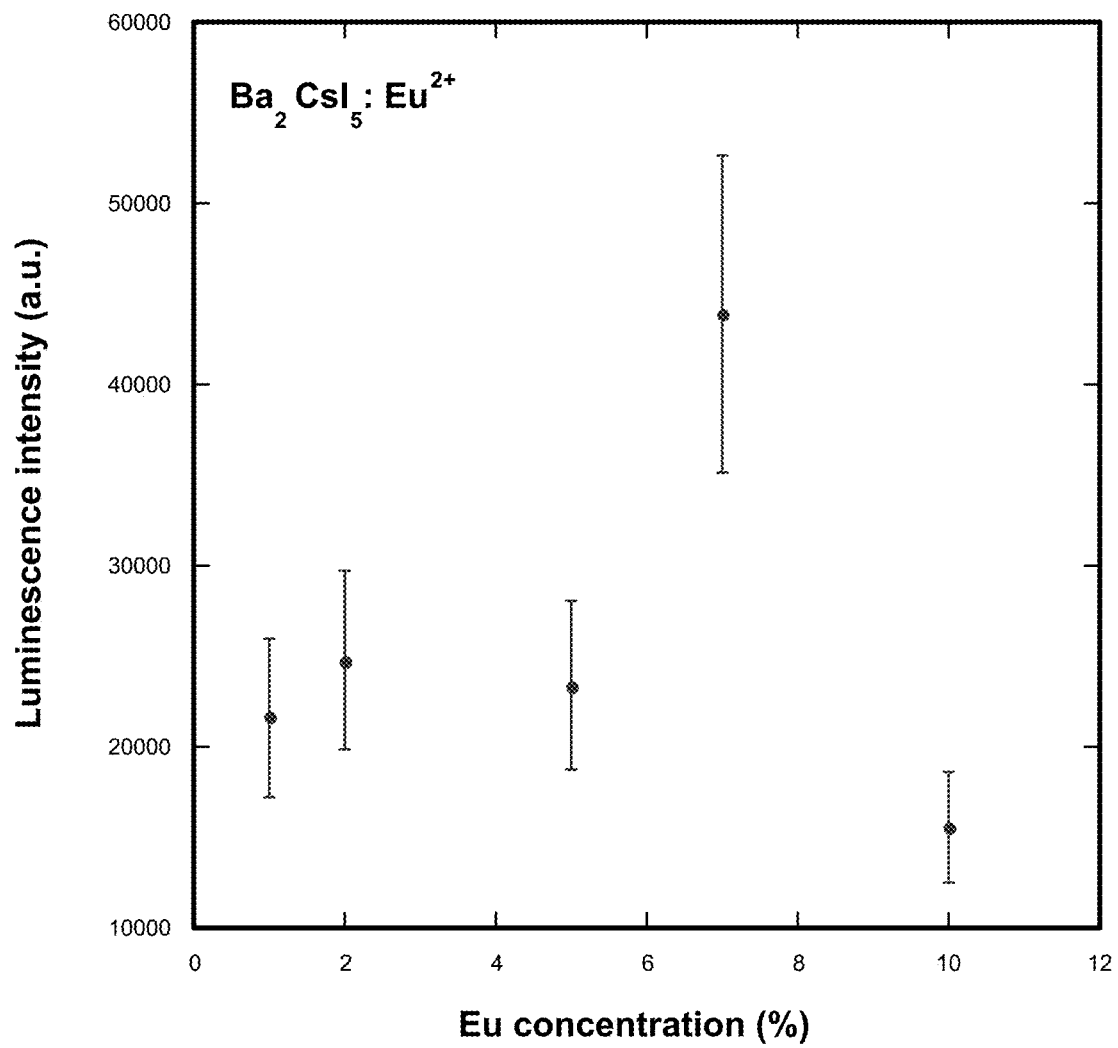
FIG. 5 shows the measured luminescence intensity of $Ba_2CsI_5$:Eu crystals for different molar percent concentrations of Eu.

Crystals of $Ba_2CsI_5$: Eu with Eu concentrations of 1%, 2%, 5%, 7%, and 10% are produced using the methods described herein. The luminescence intensities of these $Ba_2CsI_5$:Eu crystals are measured and compared. The results are shown in FIG. 5. The luminescence intensities of all of the crystals tested are comparable to each other. Of the crystals tested, the crystal with 7% Eu shows the highest luminescence intensity.

All of these inorganic scintillator crystals are useful for national security purposes, such as detecting nuclear material.

EXAMPLE 4

Synthesis of Sr2CsIs:Eu crystals with Eu concentrations ranging from 1% to 10%

Crystals of $Sr_2CsI_5$:Eu with Eu concentrations of 1%, 2%, 3%, 5%, 7%, and 10% are produced using the methods described herein. Powdered samples are prepared by solid state reactions at high temperature. The starting materials are $SrI_2$, CsI and $EuI_2$ (all commercially available from Aldrich). Stoichemetric amounts of the starting reagents are thoroughly mixed and ground together using mortar pestle in a dry box. The mixture is placed in a quartz tube that is evacuated to 10-torr at 60° C. to 150° C. for 1 hour to 2 hour and then sealed and placed in a tube furnace for reaction. The sealed quartz tube is heated at 600° C. to 725° C. for 2 hour to 24 hour. The solid product is recovered by opening the quartz tube inside a dry box. Al powder samples are characterized by X-ray diffraction technique for phase identification and x-ray excited luminescence for emission and pulsed x-ray for decay measurements. Table 1 shows the synthesis examples with synthesis conditions.

TABLE 1

Synthesis conditions of $Sr_2CsI_5$:Eu crystals with Eu concentrations ranging from 1% to 10%.

| Sample ID | Compound | $SrX_2$ (mg) | CsX (mg) | $EuX_2$ (mg) | Synthesis conditions |
|---|---|---|---|---|---|
| 17307 | $Sr_2Cs_1I_5$:2%Eu | 566 | 220 | 14 | P1:700 C./1 h/ and 625 C./24 h |
| 17346 | $Sr_2Cs_1I_5$:2%Eu | 708 | 275 | 17 | P1:675 C./24 h |
| 17347 | $Sr_2Cs_1I_5$:2%Eu | 708 | 275 | 17 | P1:700 C./24 h |
| 17348 | $Sr_2Cs_1I_5$:2%Eu | 708 | 275 | 17 | P1:725 C./24 h |
| 17349 | $Sr_2Cs_1I_5$:2%Eu | 708 | 275 | 17 | P1:750 C./24 h |
| 17350 | $Sr_2Cs_1I_5$:2%Eu | 708 | 275 | 17 | P1:700 C./1 h and 675 24 h |
| 17351 | $Sr_2Cs_1I_5$:2%Eu | 708 | 275 | 17 | P1:750 C./24 h |
| 17319 | $Sr_2Cs_1I_5$:1%Eu | 573 | 220 | 7 | P1:725 C./24 h |
| 17320 | $Sr_2Cs_1I_5$:3%Eu | 560 | 220 | 21 | P1:725 C./24 h |
| 17321 | $Sr_2Cs_1I_5$:5%Eu | 546 | 220 | 34 | P1:725 C./24 h |
| 17322 | $Sr_2Cs_1I_5$:7%Eu | 532 | 220 | 48 | P1:725 C./24 h |
| 17323 | $Sr_2Cs_1I_5$:10%Eu | 513 | 220 | 17 | P1:735 C./24 h |

Figure 9:
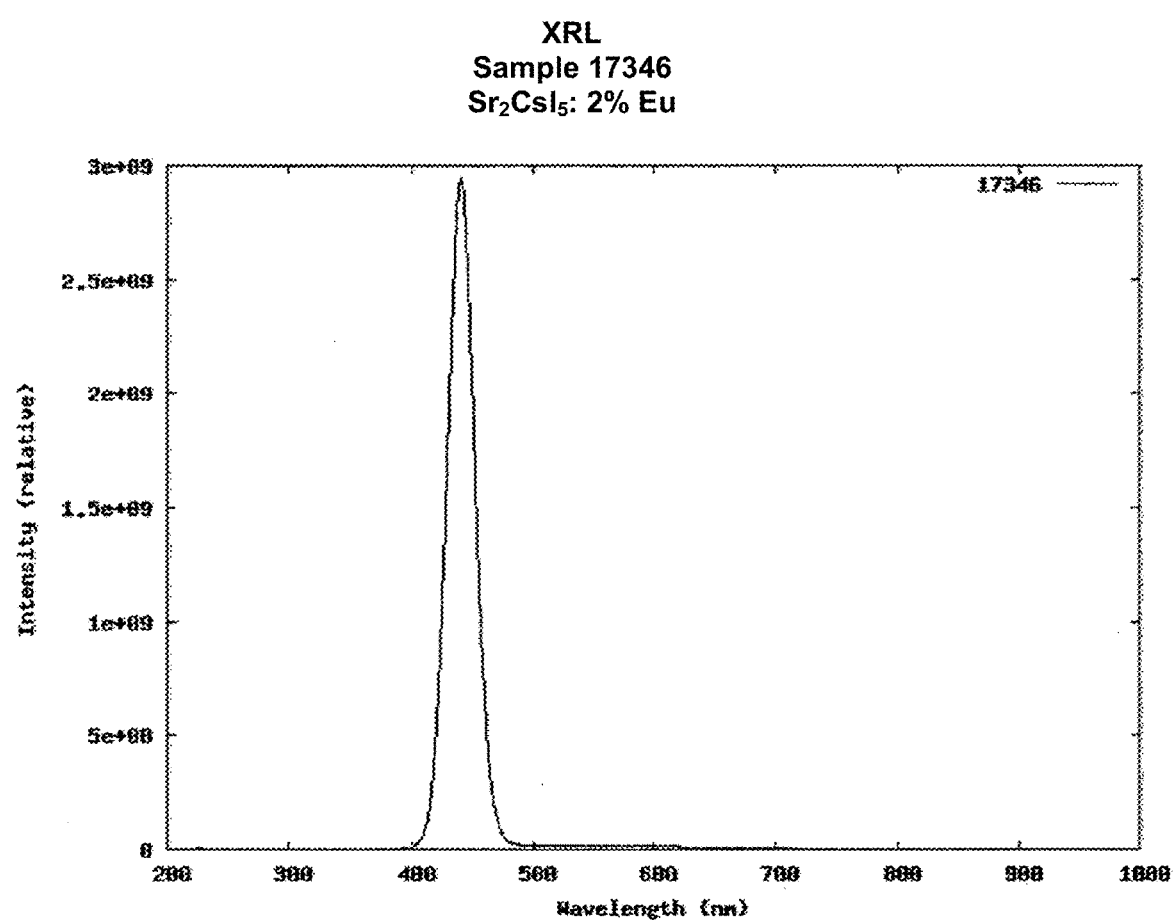
FIG. 9 shows emission spectrum of a $Sr_2CsI_5$:2% Eu crystal under x-ray excitation. The emission maximum is at ~438 nm, and the luminosity is 56,000 Ph/MeV.
Figure 10:
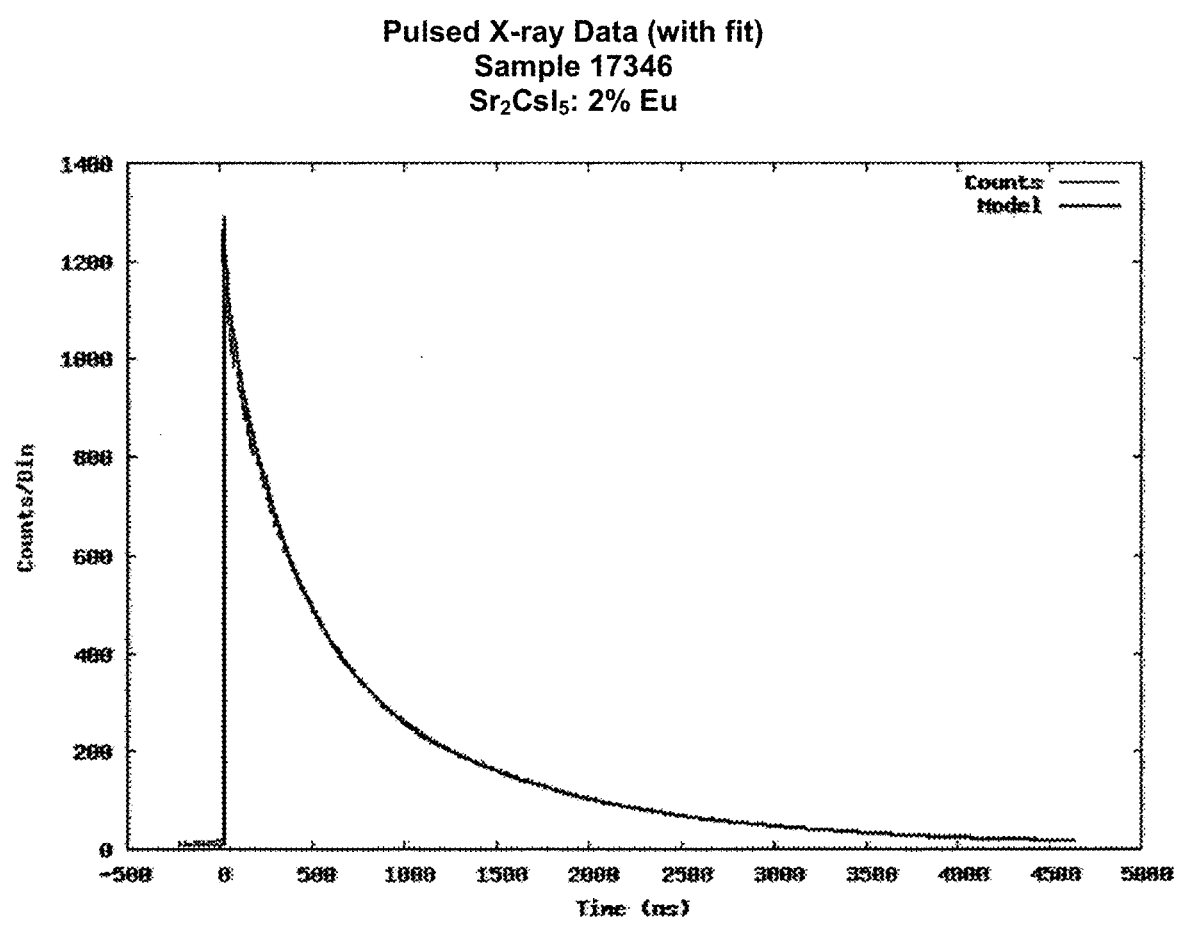
FIG. 10 shows the pulsed x-ray measurement of $Sr_2CsI_5$: 2% Eu showing a maximum luminosity of 45,000 Ph/MeV.

Powders of the composition Eu-doped strontium cesium halide are obtained by a solid state route using commercial chemicals without further purification and evaluated for scintillation properties. The present results indicate that the compositions are useful as scintillators. FIGS. 9 and 10 show the X-ray lumininescence and decay curve for one of the representative sample. The emission maximum is at ~438 nm and the estimated luminosity in the powder form is 56,000 Ph/MeV. Luminescence decay measurements indicate that the scintillator's response is fast with decay time 322.2 ns at 24%, and 1,180 ns at 70%. FIG. 11 shows luminosity as a function of Eu incorporation in the $Sr_2CsI_5$ structure. The optimum Eu concentration appears to be about 1-4% or about 2-3%. Crystals of these concentrations are bright scintillators.

EXAMPLE 5

Figure 12:
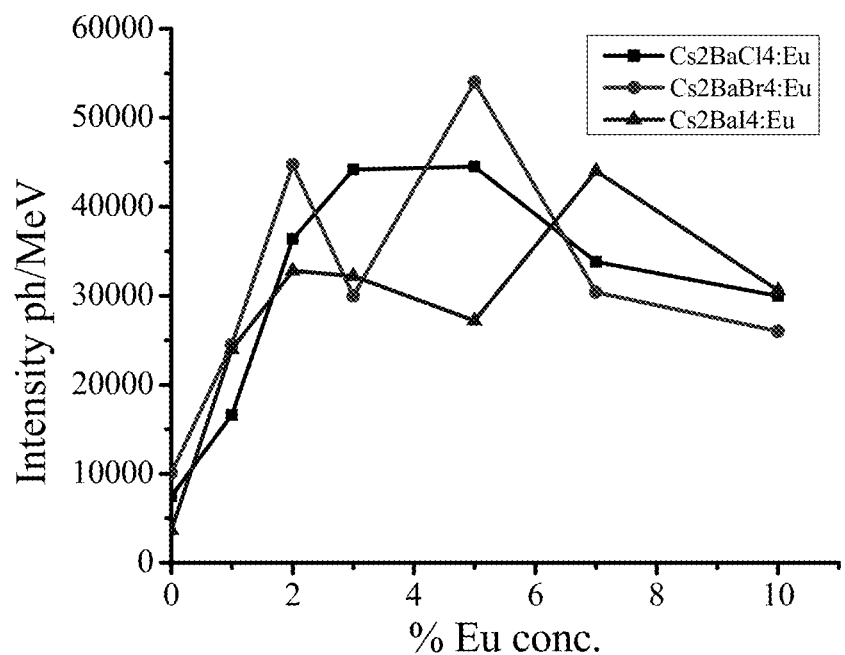
FIG. 12 shows the luminosity verses $Eu^{2+}$ concentration in $Cs_2BaX_4$:$Eu^{2+}$ compounds.
Figure 13:
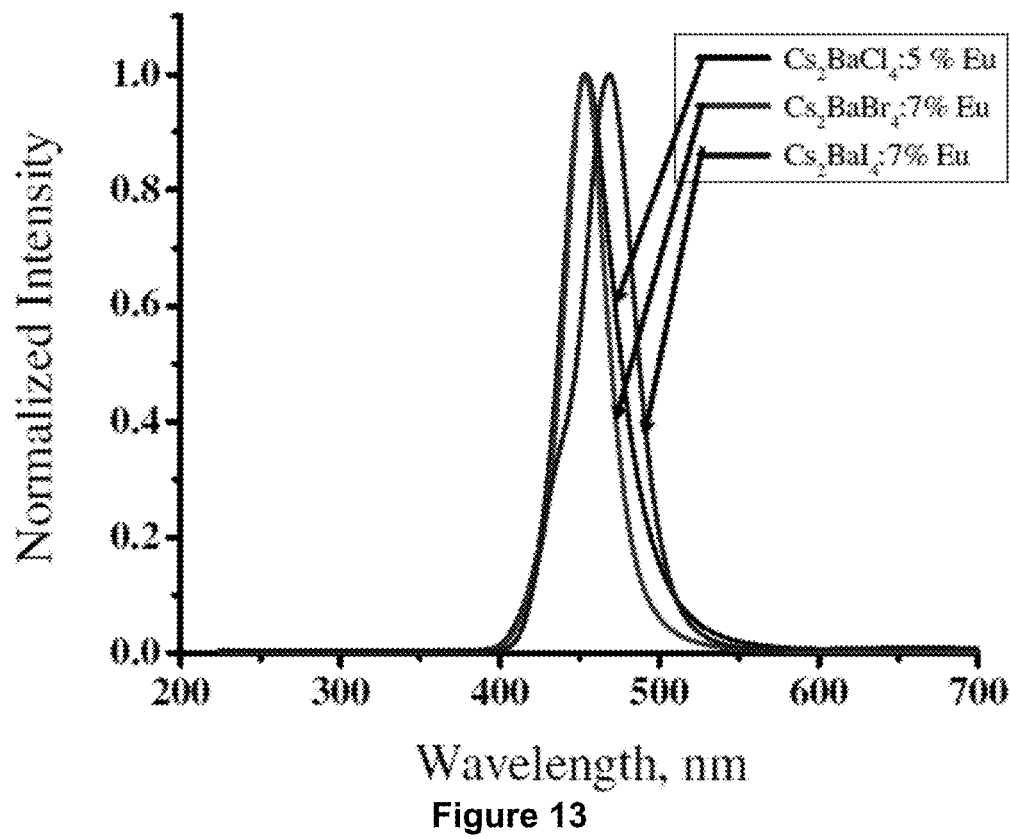
FIG. 13 shows the emission spectra of $Cs_2BaX_4$:5% $Eu^{2+}$ compounds.
Figure 14:
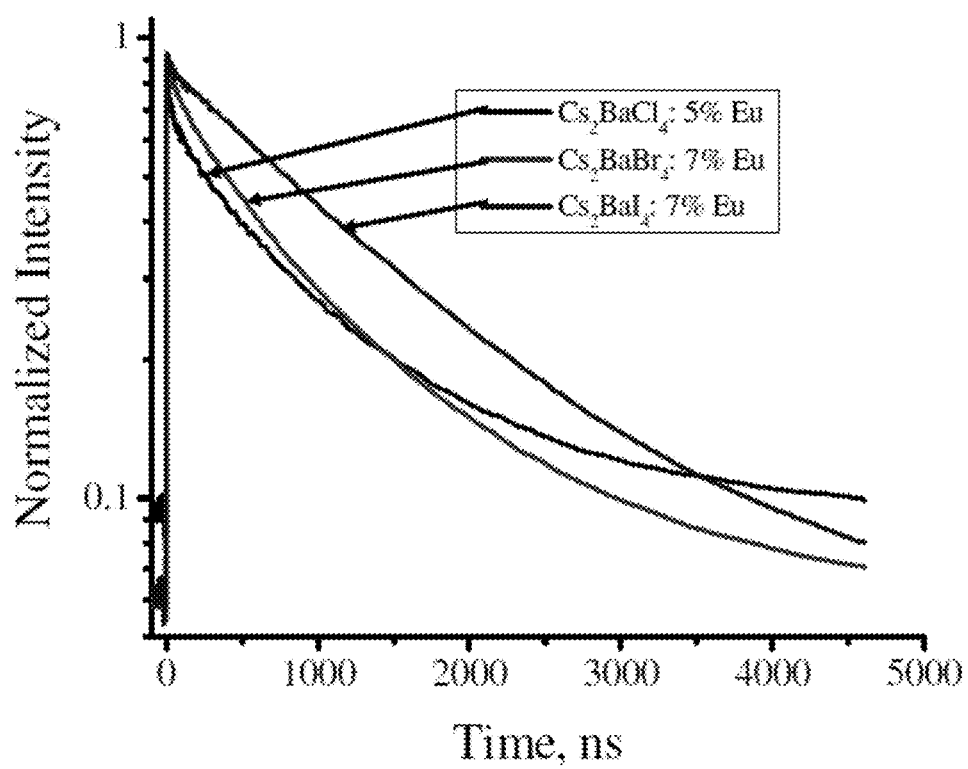
FIG. 14 shows the decay plots for the $Cs_2BaX_4$:5% $Eu^{2+}$ compounds.

Synthesis and Scintillation Properties of $Eu^{2+}$ Activated $Cs_2BaX_4$(X=Cl, Br and I) Compounds The present invention is related to the detection of gamma rays by the inorganic scintillator based on the composition $Cs_2Ba_{(1-z)}X_4$:$Eu_z$ where $0<x<10\%$. Essential qualities that a scintillator must possess are high light yields, fast luminescence decay (below 1,000 or 2,000 ns), good stopping power, high density, good energy resolution, ease of growth and stability under ambient conditions. Powders of the composition $Cs_2Ba_{(1-z)}X_4$:$Eu_z$ are obtained by a solid state route using commercial chemicals without purification and evaluated for scintillation properties. The results shown in FIGS. 12-14 and Table 2 indicate that the compositions are attractive as a scintillator.

TABLE 2

| Sample ID | Compound | Estimated Luminosity ph/MeV | % Light output in $1^{st}$ μs | Major decays (ns) Light output (%) | |
|---|---|---|---|---|---|
| | | | | τ1 | τ2 |
| 17644 | $Cs_2BaCl_4$:5% $Eu^{2+}$ | 44,500 | 42 | 440 ns (11%) | 1210 ns (44%) |
| 17675 | $Cs_2BaBr_4$:7% $Eu^{2+}$ | 54,000 | 46 | 368 ns (9%) | 1040 ns (49%) |
| 17714 | $Cs_2BaI_4$:7% $Eu^{2+}$ | 52,800 | 44 | — | 1252 ns (68%) |

The emission maximum is ~445 nm for all compounds. The estimated luminosity in the powder form are 44,500 ph/MeV, 54,000 ph/MeV and 52,800 ph/MeV for $Cs_2BaCl_4$: 5% $Eu^{2+}$, $Cs_2BaBr_4$:7% $Eu^{2+}$, $Cs_2BaI_4$:7% $Eu^{2+}$, respectively. Luminescence decay measurements indicate that the scintillators response is fast enough for home land security application. Crystals of these compositions expected to produce a bright scintillator.

$Cs_2BaX_4$:$Eu^{2+}$ compounds can be synthesized using the following procedure. Powder samples are prepared by solid state reactions at high temperature. All starting materials $BaCl_2$, $BaBr_2$, $BaI_2$, CsCl, CsBr, CsI, $EuCl_2$, $EuI_2$, are obtained from Aldrich except $EuBr_2$ which was from Alfa Aesar. Stoichiometric amounts of the starting reagents are thoroughly mixed and ground together using mortar pestle in a dry box. The mixture is placed in a quartz tube that was evacuated to $10^{-6}$ ton at 150° C. for ~2-4h. The quartz tube is sealed and then placed in a tube furnace for heating. The sealed quartz tube is heated at conditions described below. The solid product is recovered by opening quartz tube inside the dry box. All powder samples are checked by means of X-ray powder diffraction technique for phase identification and x-ray excited luminescence for emission and decay measurements. Table 3 provides synthesis examples with synthesis conditions.

TABLE 3

| Sample ID | Compound | $BaX_2$ (mg) | CsX (mg) | $EuX_2$ (mg) | Synthesis conditions |
|---|---|---|---|---|---|
| 17605 | $Cs_2BaCl_4$:1% $Eu^{2+}$ | 303 | 494 | 3 | 850° C./10 h and 600° C./10 h |
| 17604 | $Cs_2BaCl_4$:2% $Eu^{2+}$ | 299 | 494 | 7 | 850° C./10 h and 600° C./10 h |
| 17641 | $Cs_2BaCl_4$:3% $Eu^{2+}$ | 296 | 494 | 10 | 850° C./10 h and 600° C./10 h |
| 17644 | $Cs_2BaCl_4$:5% $Eu^{2+}$ | 290 | 494 | 16 | 850° C./10 h and 600° C./10 h |
| 17645 | $Cs_2BaCl_4$:8% $Eu^{2+}$ | 280 | 494 | 26 | 850° C./10 h and 600° C./10 h |
| 17646 | $Cs_2BaCl_4$:10% $Eu^{2+}$ | 275 | 494 | 33 | 850° C./10 h/ 600° C./10 h |
| 17608 | $Cs_2BaBr_4$:1% $Eu^{2+}$ | 326 | 471 | 4 | 860° C./10 h |
| 17297 | $Cs_2BaBr_4$:2% $Eu^{2+}$ | 322 | 471 | 7 | 860° C./10 h |

TABLE 3-continued

| Sample ID | Compound | $BaX_2$ (mg) | CsX (mg) | $EuX_2$ (mg) | Synthesis conditions |
|---|---|---|---|---|---|
| 17610 | $Cs_2BaBr_4$:3% $Eu^{2+}$ | 319 | 471 | 10 | 860° C./10 h |
| 17650 | $Cs_2BaBr_4$:5% $Eu^{2+}$ | 312 | 471 | 17 | 860° C./10 h |
| 17655 | $Cs_2BaBr_4$:7% $Eu^{2+}$ | 305 | 471 | 24 | 860° C./10 h |
| 17656 | $Cs_2BaBr_4$:10% $Eu^{2+}$ | 295 | 471 | 34 | 860° C./10 h |
| 17625 | $Cs_2BaI_4$:1% $Eu^{2+}$ | 340 | 456 | 4 | 740° C./5 h and 650° C./24 h |
| 17626 | $Cs_2BaI_4$:2% $Eu^{2+}$ | 337 | 456 | 7 | 740° C./5 h and 650° C./24 h |
| 17627 | $Cs_2BaI_4$:3% $Eu^{2+}$ | 333 | 456 | 11 | 740° C./5 h and 650° C./24 h |
| 17628 | $Cs_2BaI_4$:5% $Eu^{2+}$ | 326 | 456 | 18 | 740° C./5 h and 650° C./24 h |
| 17671 | $Cs_2BaI_4$:7% $Eu^{2+}$ | 319 | 456 | 25 | 740° C./5 h and 650° C./24 h |
| 17654 | $Cs_2BaI_4$:10% $Eu^{2+}$ | 309 | 456 | 36 | 740° C./5 h and 650° C./24 h |

These inorganic scintillator crystals are useful for national security purposes, such as detecting nuclear material.

EXAMPLE 6

$Eu^{2+}$ activated $CsSrX_3$ (X=Cl, Br, I) as scintillator materials

Figure 15:
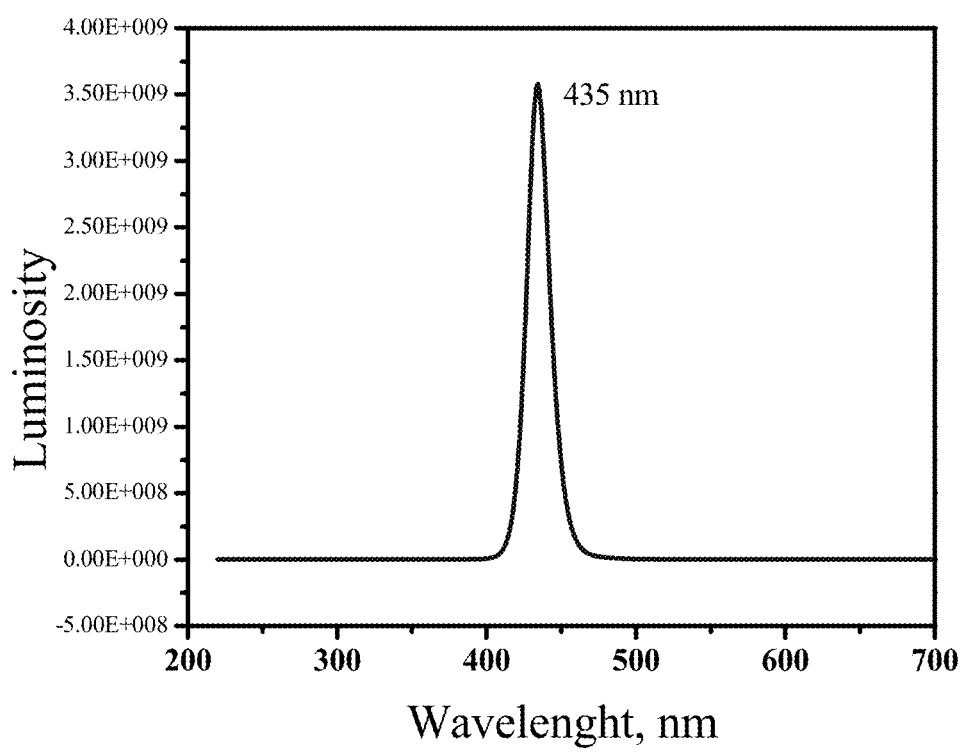
FIG. 15 shows the emission spectra of $CsSrBr_3$:3% $Eu^{2+}$ compounds.
Figure 16:
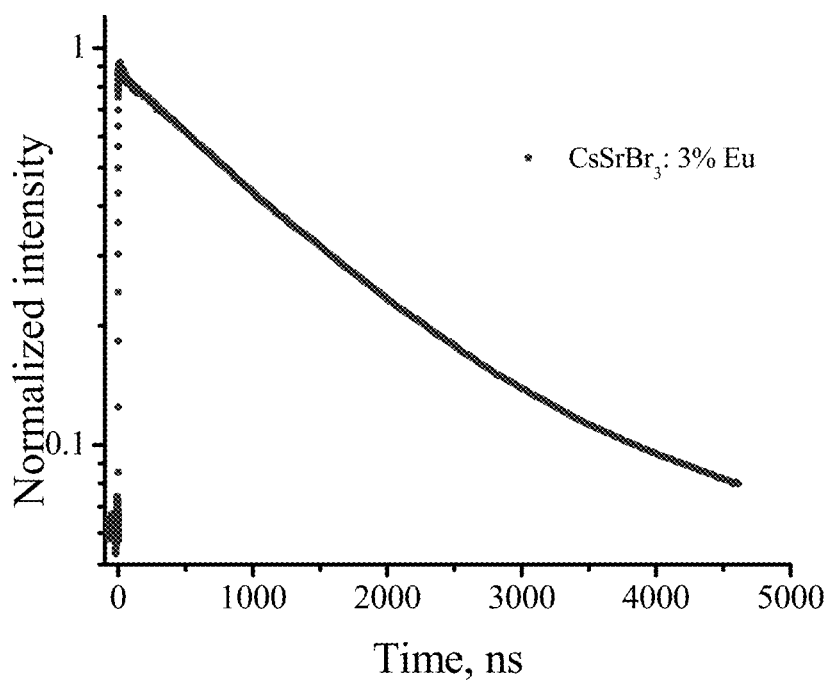
FIG. 16 shows the decay plots for the $CsSrBr_3$:5% $Eu^{2+}$ compounds.

The following invention is related to the detection of gamma rays by the inorganic scintillator based on the composition $CsSr_{(1-x)}X_3$:$Eu_x$ where 0<x<10%. Powders of the composition $Cs_2Sr_{(1-x)}X_3$:$Eu_x$ were obtained by the melt solidification route using commercial chemicals without purification and evaluated for scintillation properties. The results shown in FIGS. 15-17 and Table 4 indicate that the compositions are attractive as a scintillator.

TABLE 4

Decay characteristics of $CsSrBr_3$:$Eu^{2+}$ compounds.

| Sample | Compound | Estimated Luminosity ph/MeV | % Light output in $1^{st}$ μs | Major decays (ns) Light output (%) | |
|---|---|---|---|---|---|
| | | | | τ1 | τ2 |
| 1 | $CsSrBr_3$:1% $Eu^{2+}$ | 11,400 | 59 | 341 ns (6%) | 1170 ns (90%) |
| 2 | $CsSrBr_3$:3% $Eu^{2+}$ | 47,500 | 49 | 240 ns (10%) | 1280 ns (92%) |
| 3 | $CsSrBr_3$:5% $Eu^{2+}$ | 24,400 | 51 | 230 ns (9%) | 1280 ns (61%) |

Figure 17:
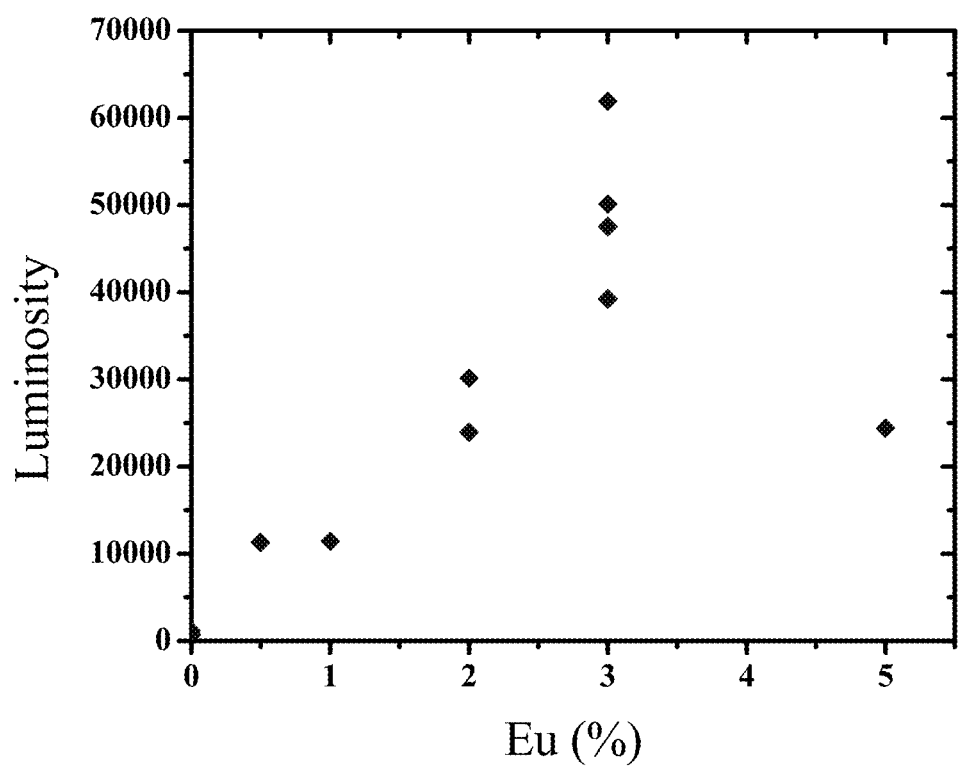
FIG. 17 shows the plot of luminescence verses $Eu^{2+}$ concentration in various $CsSrBr_3$: $Eu^{2+}$ compounds.
Figure 18:
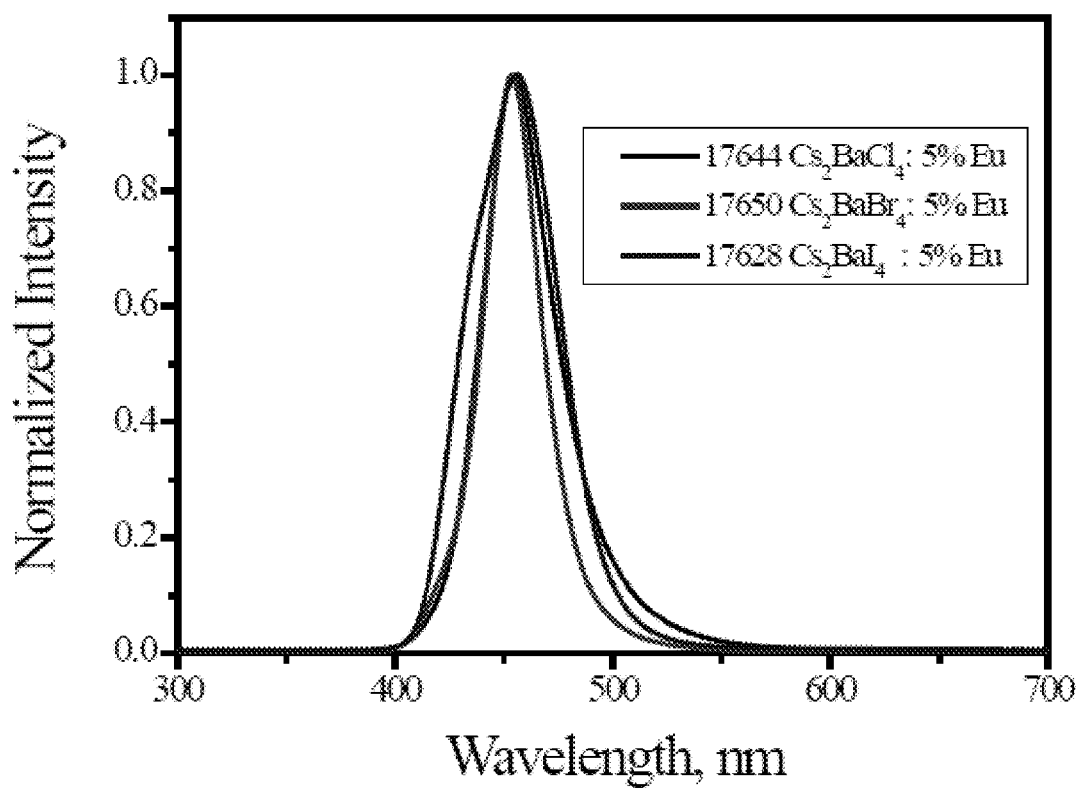
FIG. 18 shows the emission spectra of $Cs_2BaX_4$:5% Eu compounds.
Figure 19:
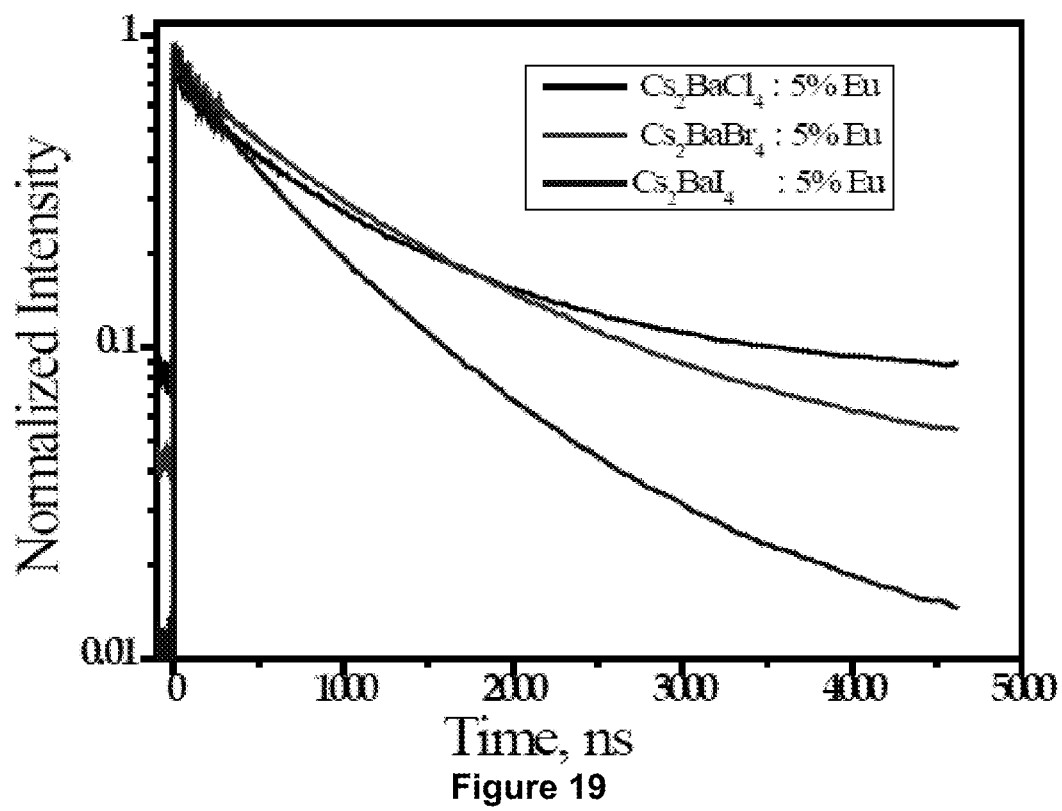
FIG. 19 shows the decay plots for the $Cs_2BaX_4$:5% Eu compounds.
Figure 20:
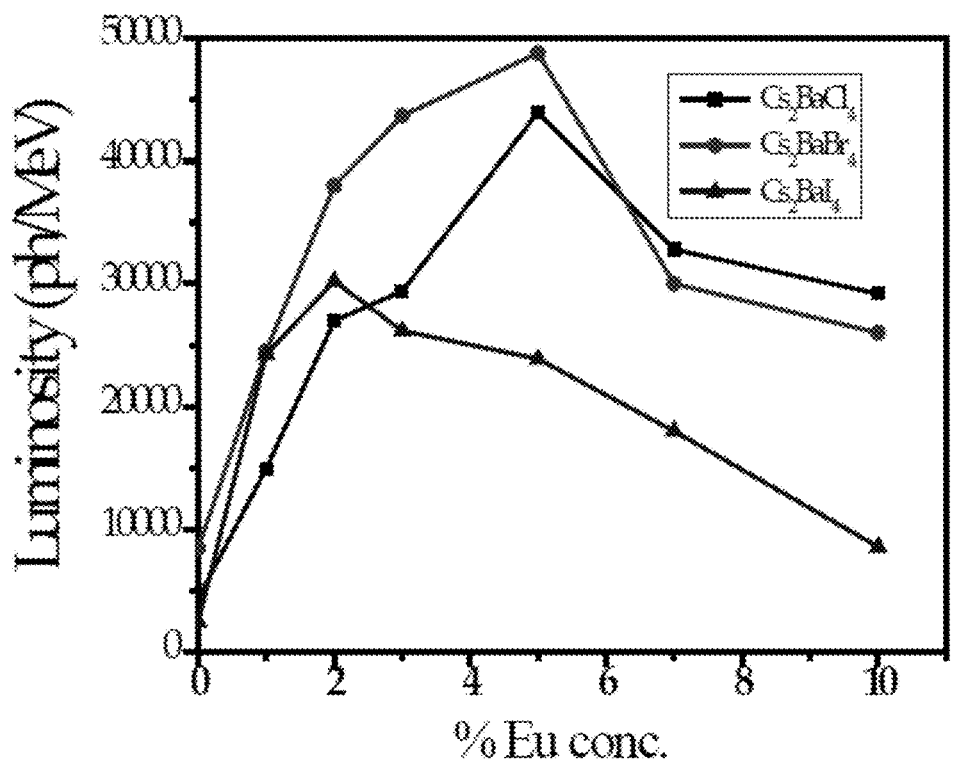
FIG. 20 shows the plots of luminescence verses Eu concentration in various $Cs_2BaX_4$: Eu compounds.

The emission maximum is ~435 nm for all compounds and the CsSrBr$_3$:3% Eu$^{2+}$ is the most luminescence compound 47,500 ph/MeV. The luminescence decay measurements indicate that the scintillators response is fast enough for homeland security application. FIG. 17 presents luminescence as a function of Eu$^{2+}$ concentration in CsSrBr$_3$ compound.

CsSrBr$_3$:Eu$^{2+}$ compounds can be synthesized using the following procedure. Powder samples are prepared by solid state reactions at high temperature. All starting materials SrBr$_2$, CsBr, are from Aldrich and EuBr$_2$ was obtained from Alfa Aesar. Stoichiometric amounts of the starting reagents are thoroughly mixed and ground together using mortar pestle in a dry box. The mixture was placed in a quartz tube that is evacuated to 10$^{-6}$ torr at 150° C. for 2 to 4 h. The quartz tube is sealed and then placed in a tube furnace for heating. The sealed quartz tube is heated at conditions described below. The solid product is recovered by opening quartz tube inside the dry box. All powder samples are checked by means of X-ray powder diffraction technique for phase identification and x-ray excited luminescence for emission and decay measurements. Table 5 provides synthesis examples with synthesis conditions.

TABLE 5

| Sample ID | Compound | SrBr$_2$ (mg) | CsBr (mg) | EuBr$_2$ (mg) | Synthesis conditions |
|---|---|---|---|---|---|
| 1 | CsSrBr$_3$:0% Eu$^{2+}$ | 303 | 370 | 0 | 925° C./100 h |
| 2 | CsSrBr$_3$:0.5% Eu$^{2+}$ | 428 | 370 | 3 | 925° C./100 h |
| 3 | CsSrBr$_3$:1% Eu$^{2+}$ | 425 | 370 | 5 | 925° C./100 h |
| 4 | CsSrBr$_3$:2% Eu$^{2+}$ | 419 | 370 | 11 | 925° C./100 h |
| 5 | CsSrBr$_3$3%E Eu$^{2+}$ | 415 | 368 | 16 | 925° C./100 h |
| 6 | CsSrBr$_3$:5% Eu$^{2+}$ | 406 | 367 | 27 | 925° C./100 h |

These inorganic scintillator crystals are useful for national security purposes, such as detecting nuclear material.

EXAMPLE 7

Eu$^{2+}$ activated Cs$_2$BaX$_4$ (X=Cl, Br, I) as scintillator materials

The present invention is related to the detection of gamma rays by the inorganic scintillator based on the composition Cs$_2$Ba$_{(1-x)}$X$_4$:Eu$_x$ where 0<x>10%. Essential qualities that a scintillator must possess are high light yields, fast luminescence decay (below 1000 ns), good stopping power, high density, good energy resolution, ease of growth and stability under ambient conditions. Powders of the composition Cs$_2$Ba$_{(1-x)}$X$_4$:Eu$_x$ were obtained by a solid state route using commercial chemicals without purification and evaluated for scintillation properties. The results presented below indicate that the composition might be attractive as a scintillator. Table 6 shows the decay characteristics of Cs$_2$BaX$_4$:5% Eu compounds.

TABLE 6

| Sample | Compound | Eastimated Luminosity ph/MeV | % Light output in 1st ps | Major decays (ns) Light output (%) τ1 | τ2 |
|---|---|---|---|---|---|
| 1 | Cs$_2$BaCl$_4$:5%Eu | 44,500 | 41 | 440 ns (11%) | 1210 ns (44%) |
| 2 | Cs$_2$BaBr$_4$:5%Eu | 48,800 | 49 | 432 ns (11%) | 1300 ns (65%) |
| 3 | Cs$_2$BaI$_4$:5%Eu | 24,000 | 64 | 230 ns (5%) 600 ns (47%) | 1280 ns (40%) |

The emission maximum is ~445 nm for all compounds and the estimated luminosities in the powder form are 44,500 ph/MeV, 48,800 ph/MeV and 24,000 ph/MeV for Cs$_2$BaCl$_4$:5% Eu, Cs$_2$BaBr$_4$:5% Eu, Cs$_2$BaI$_4$:5% Eu, respectively. The luminescence decay measurements indicate that the scintillators response is fast enough for homeland security application.

Powder samples are prepared by solid state reactions at high temperature. All starting materials BaCl$_2$, BaBr$_2$, BaI$_2$, CsCl, CsBr, CsI, EuCl$_2$, EuI$_2$, are obtained from Aldrich except EuBr$_2$ which is from Alfa Aesar. Stoichiometric amounts of the starting reagents are thoroughly mixed and ground together using mortar pestle in a dry box. The mixture is placed in a quartz tube that is evacuated to 10-6 torr at 150° C. for 2 to 4 h. The quartz tube is sealed and then placed in a tube furnace for heating. The sealed quartz tube is heated at conditions described below in Table 7. The solid product is recovered by opening quartz tube inside the dry box. All powder samples are checked by means of X-ray powder diffraction technique for phase identification and x-ray excited luminescence for emission and decay measurements. Table 6 provides synthesis examples with synthesis conditions.

TABLE 7

Cs$_2$BaX$_4$:Eu compounds: Typical Synthesis Procedure.3

| Sample ID | Compound | BaX$_2$ (mg) | CsX (mg) | EuX$_2$ (mg) | Synthesis conditions |
|---|---|---|---|---|---|
| 1 | Cs$_2$BaCl$_4$:1%Eu | 303 | 494 | 3 | 850° C./10 h and 600° C./10 h |
| 2 | Cs$_2$BaCl$_4$:2%Eu | 299 | 494 | 7 | 850° C./10 h and 600° C./10 h |
| 3 | Cs$_2$BaCl$_4$:3%Eu | 296 | 494 | 10 | 850° C./10 h and 600° C./10 h |
| 4 | Cs$_2$BaCl$_4$:5%Eu | 290 | 494 | 16 | 850° C./10 h and 600° C./10 h |
| 5 | Cs$_2$BaCl$_4$:8%Eu | 280 | 494 | 26 | 850° C./10 h and 600° C./10 h |
| 6 | Cs$_2$BaCl$_4$:10%Eu | 275 | 494 | 33 | 850° C./10 h/ 600° C./10 h |
| 7 | Cs$_2$BaBr$_4$:1%Eu | 326 | 471 | 4 | 860° C./10 h |
| 8 | Cs$_2$BaBr$_4$:2%Eu | 322 | 471 | 7 | 860° C./10 h |
| 9 | Cs$_2$BaBr$_4$:3%Eu | 319 | 471 | 10 | 860° C./10 h |
| 10 | Cs$_2$BaBr$_4$:5%Eu | 312 | 471 | 17 | 860° C./10 h |
| 11 | Cs$_2$BaBr$_4$.7%Eu | 305 | 471 | 24 | 860° C./10 h |
| 12 | Cs$_2$BaBr$_4$:10%Eu | 295 | 471 | 34 | 860° C./10 h |
| 13 | Cs$_2$BaI$_4$:1%Eu | 340 | 456 | 4 | 740° C./5 h and 650° C./24 h |
| 14 | Cs$_2$BaI$_4$:2%Eu | 337 | 456 | 7 | 740° C./5 h and 650° C./24 h |
| 15 | Cs$_2$BaI$_4$:3%Eu | 333 | 456 | 11 | 740° C./5 h and 650° C./24 h |
| 16 | Cs$_2$BaI$_4$:5%Eu | 326 | 456 | 18 | 740° C./5 h and 650° C./24 h |

TABLE 7-continued

Cs$_2$BaX$_4$:Eu compounds: Typical Synthesis Procedure.3

| Sample ID | Compound | BaX$_2$ (mg) | CsX (mg) | EuX$_2$ (mg) | Synthesis conditions |
|---|---|---|---|---|---|
| 17 | Cs$_2$BaI$_4$:7%Eu | 319 | 456 | 25 | 740° C./5 h and 650° C./24 h |
| 18 | Cs$_2$BaI$_4$:10%Eu | 309 | 456 | 36 | 740° C./5 h and 650° C./24 h |

EXAMPLE 8

Characterization of BaFI:Eu

Figure 21:
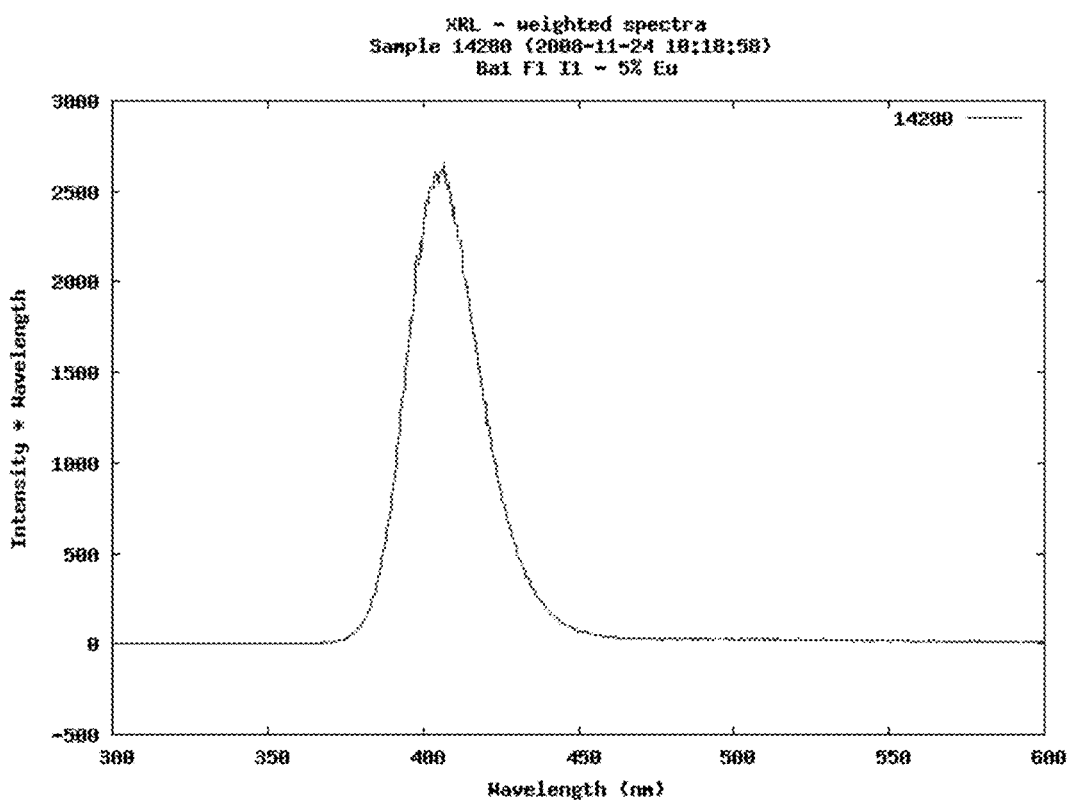
FIG. 21 shows the X-ray luminescence for a BaFI:$Eu^{2+}$ single crystal sample.
Figure 22:
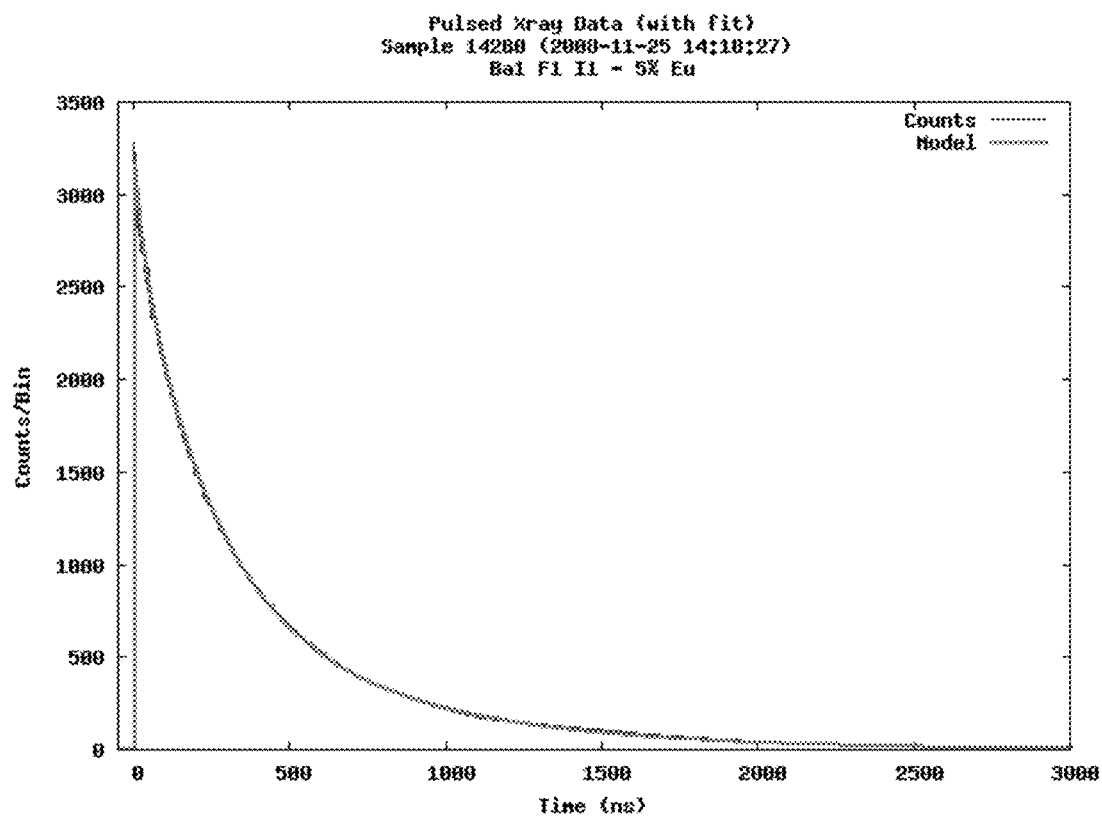
FIG. 22 shows the decay curves for a BaFI:$Eu^{2+}$ single crystal sample.

Single crystals of the composition BaFI:Eu are obtained by the Bridgman growth technique using commercial chemicals without further purification. A melting temperature of 960° C. and a homogenization time of 2 hours is used. The cooling rate (or directional solidification rate) is 1 mm/hour in a temperature gradient of 50° C./cm. Presented in FIGS. 21 and 22 are X-ray luminescence and decay curves for a BaFI:Eu sample. The emission maximum is at ~405 nm and the estimated luminosity several tens of thousands photons/MeV. Luminescence decay measurements indicate that the scintillators response is fast with nearly the entire amount of light decaying within 620 ns. In addition, BaFI:Eu is not sensitive to moisture and the samples can be handled and stored under ambient conditions.

These inorganic scintillator crystals are useful for national security purposes, such as detecting nuclear material.

EXAMPLE 9

Synthesis and Characterization of BaBrI:Eu

Eu$^{2+}$ and Ce$^{3+}$-activated barium halides of the form BaX$_2$(X=Cl, Br, I) have been investigated and found to be attractive candidates (N. Cherepy et al, Appl. Phys. Lett. 2007, 92, 083508; J. Selling et al, IEEE Trans. Nucl. Sci. 2008, 55, 1183). Some of the mixed halides compounds are known x-ray phosphors, but have never been used for gamma detection.

Figure 23:
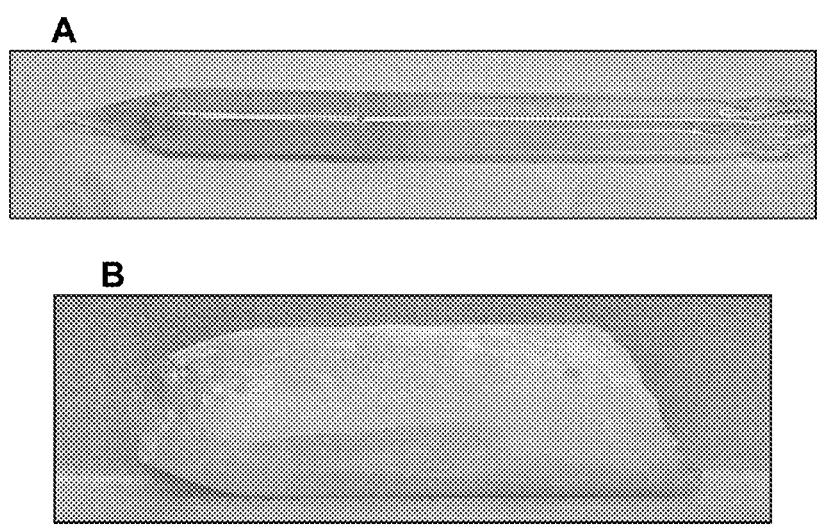
FIG. 23 shows a BaBrI:$Eu^{2+}$ single crystal: inside the quartz ampoule (panel A), and out of the ampoule (panel B). The cross-sectional width of the crystal is about 1 cm.
Figure 24:
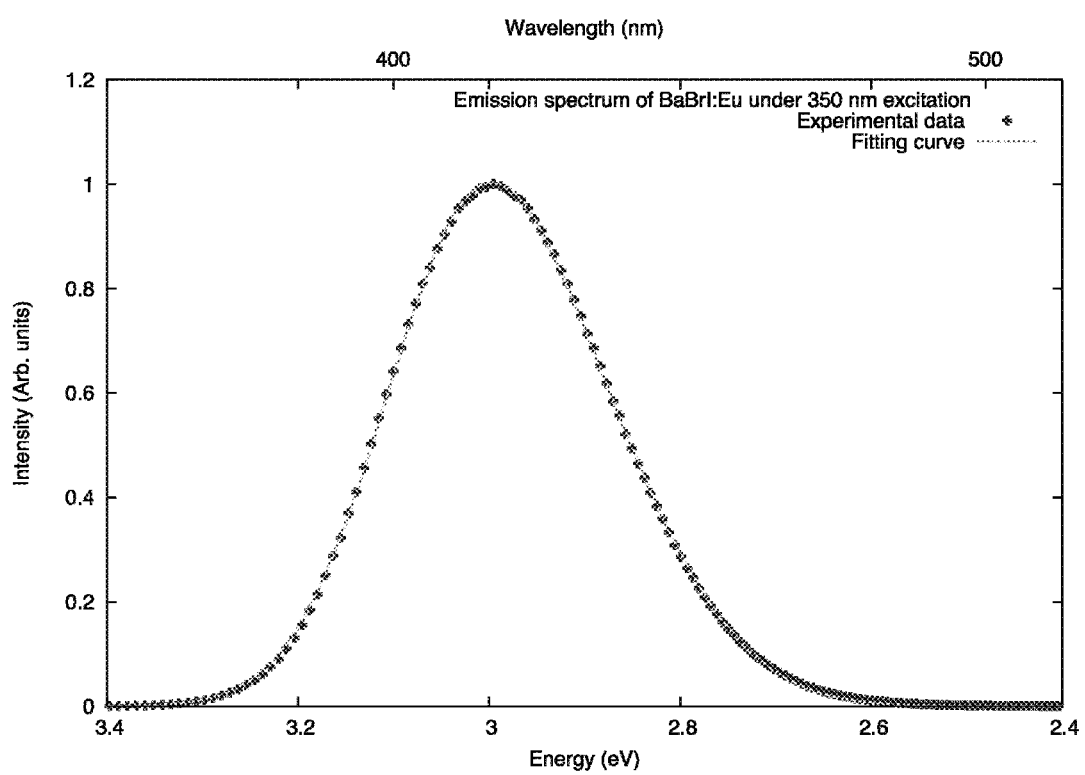
FIG. 24 shows the photoluminescence spectrum showing an emission wavelength at 450 nm for a BaBrI:$Eu^{2+}$ single crystal.
Figure 25:
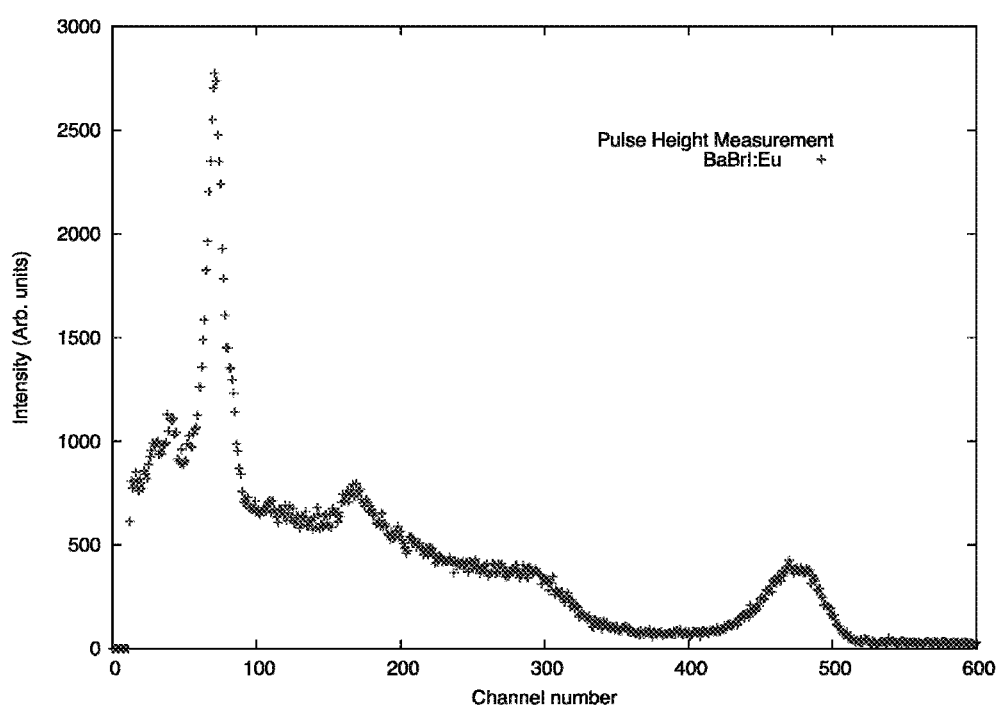
FIG. 25 shows the X-ray luminescence decay curves for a BaBrI:$Eu^{2+}$ single crystal.
Figure 26:
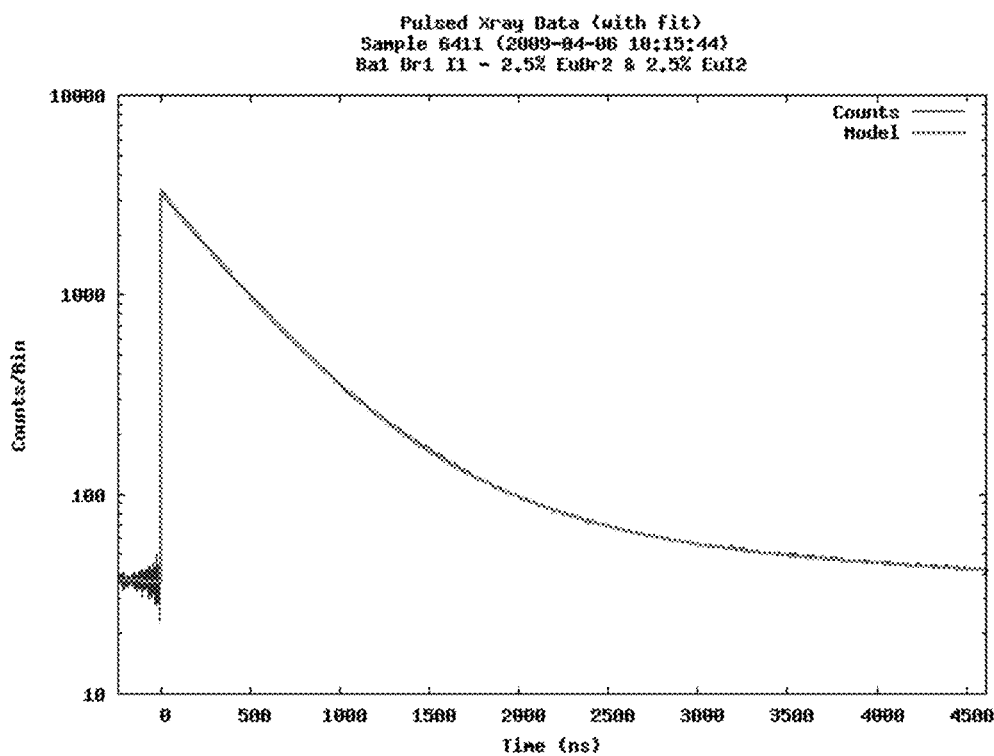
FIG. 26 shows the response of the crystal to gamma radiation (pulse height measurement) of a BaBrI:$Eu^{2+}$ single crystal.

Micro-crystalline powder and single crystal compositions BaBrI doped with Eu$^{2+}$ for scintillator applications are synthesized. A crystal is obtained by the Bridgman growth technique starting with a mixture of stoichiometric amounts of the respective halides in a sealed quartz tube (See FIG. 23). A melting temperature of 850° C. and a homogenization time of 2 hours is used. The cooling rate (or directional solidification rate) is 1 mm/hour in a temperature gradient of 50° C./cm. Reactants are used as obtained from the manufacturer without any purification. FIGS. 24-26 shows the photoluminescence spectrum showing an emission wavelength at 410 nm for the single crystal, the X-ray luminescence decay curves and the response of the crystal to gamma radiation (pulse height measurement). The new inorganic scintillator crystal properties are compared to those of SrI$_2$:Eu reported by others. The new inorganic scintillator crystal has a higher stopping power for stopping gamma-rays than SrI$_2$:Eu, and a faster luminescence decay time.

Depending on the activator concentration, measurements show that the range of response and light decay encompass the following: a luminescence decay of 83% of the light decaying within 700 ns, and a luminescence decay of 98% of the light decaying within 500 ns. This crystal has a high luminescence output (over 75,000 ph/MeV), fast decay and ease of growth at low cost.

Figure 27:
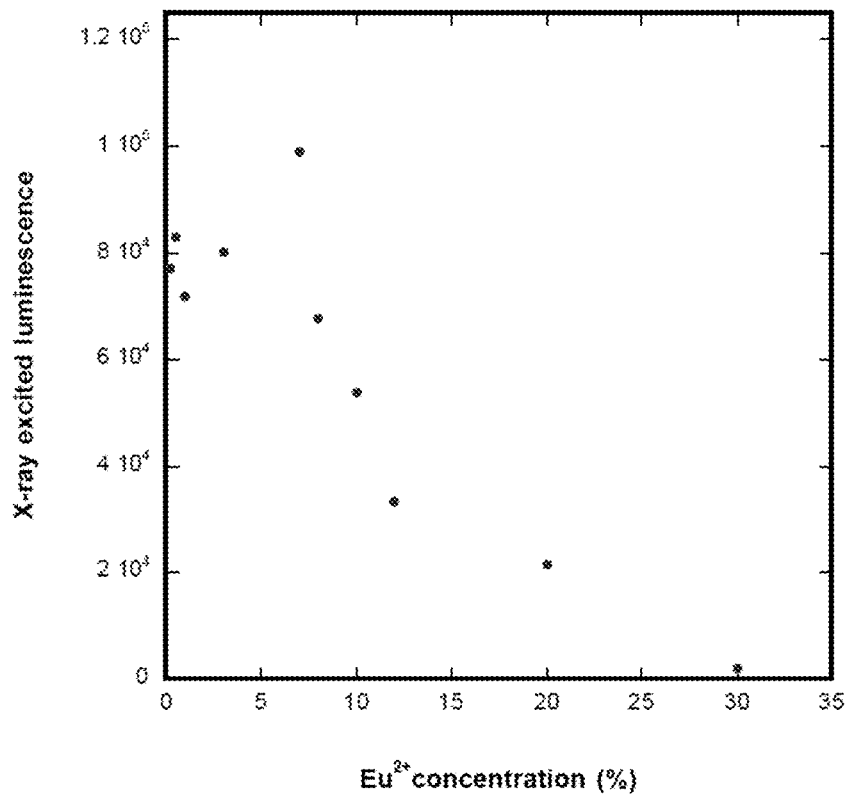
FIG. 27 shows the plot of luminescent intensity (estimated photons/MeV) as a function of $Eu^{2+}$ concentration in BaBrI.
Figure 28:
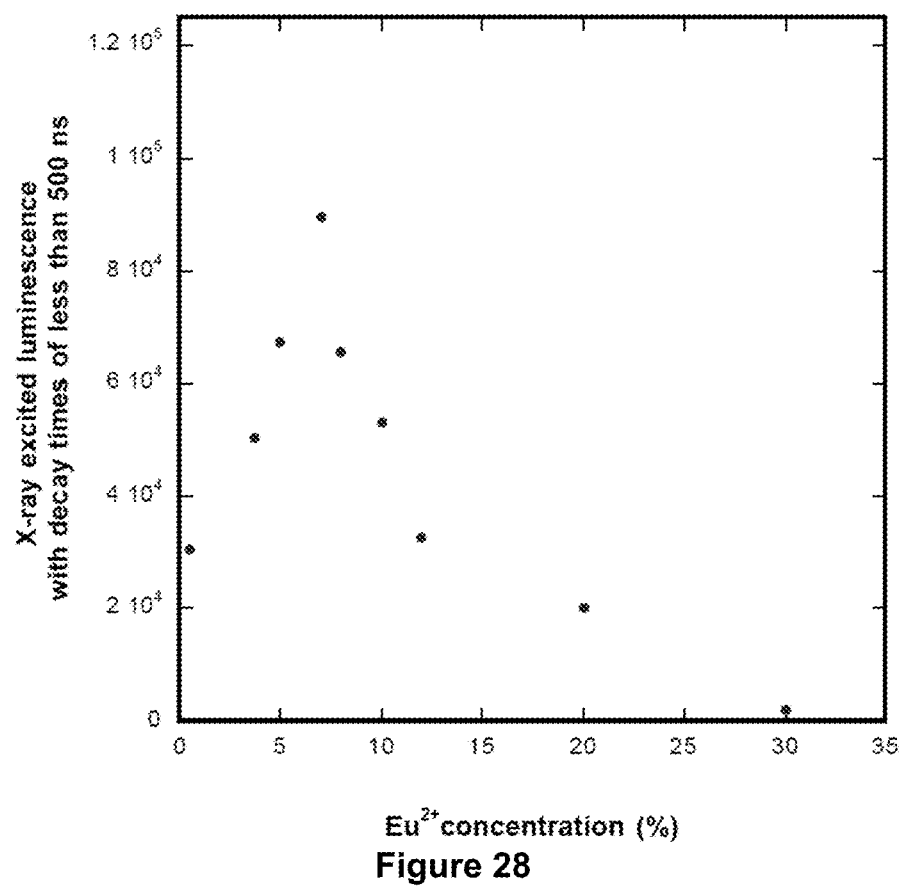
FIG. 28 shows the plot of the amount of luminescence with decay times of less than 500 ns (estimated photons/MeV) as a function of $Eu^{2+}$ concentration in BaBrI.

FIGS. 27 and 28 show the plots of luminescent intensity (estimated photons/MeV) and the amount of luminescence with decay times of less than 500 ns (estimated photons/MeV), respectively, as functions of the Eu$^{2+}$ concentration (up to 30%) in BaBrI.

These inorganic scintillator crystals are useful for national security purposes, such as detecting nuclear material.

EXAMPLE 10

Synthesis and Characterization of BaCII:Eu

Crystals of BaCII doped with Eu$^{2+}$ for scintillator applications are synthesized using the techniques described herein.

Figure 29:
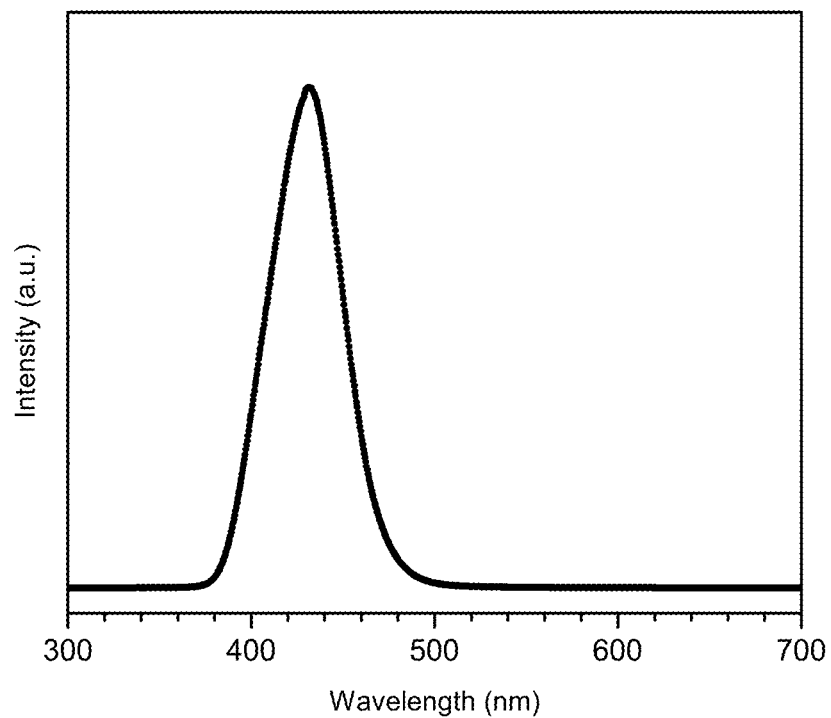
FIG. 29 shows the photoluminescence spectrum for a BaClI:$Eu^{2+}$ sample.
Figure 30:
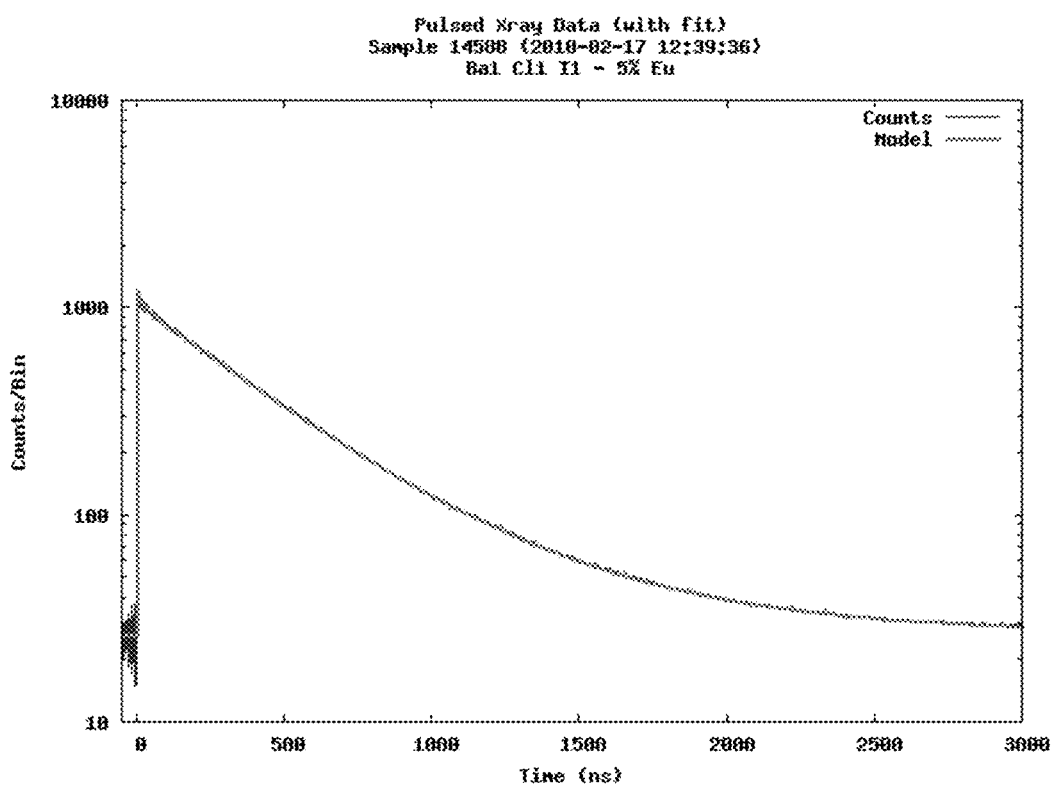
FIG. 30 shows the decay curves for a BaClI:5% $Eu^{2+}$ sample.
Figure 31:
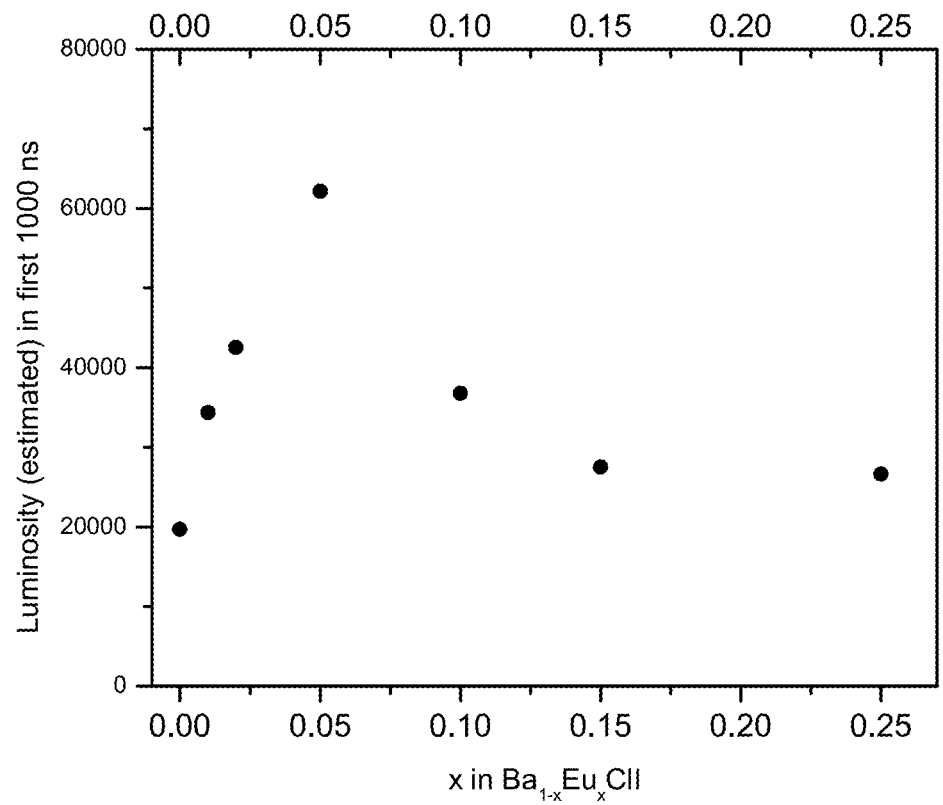
FIG. 31 shows the fraction of luminescence intensity decaying in the first 1,000 ns as a function of the $Eu^{2+}$ concentration in BaClI.

FIG. 29 shows the photoluminescence spectrum showing an emission wavelength between 420 nm and 440 nm, or at about 430 nm, for a BaCII:Eu$^{2+}$ sample. FIG. 30 shows the decay curves for a BaCII:5% Eu$^{2+}$ sample. FIG. 31 shows the fraction of luminescence intensity decaying in the first 1,000 ns as a function of the Eu$^{2+}$ concentration in BaCII.

These inorganic scintillator crystals are useful for national security purposes, such as detecting nuclear material.

EXAMPLE 11

Experimental: Crystals with the general composition Sr$_a$-Ba$_b$Eu$_{1-a-b}$Br$_{2-c}$I$_c$(0<a≤1; 0≤b<1; 0<c) are grown either by the melt or the Bridgman technique. Samples are obtained by the melt technique using a procedure similar to Hodorowicz et al. (S. A. Hodorowicz and H. A. Eick, Journal of Solid State Chemistry, 1983, 46, 313-320, incorporated herein by reference). High-purity reactants are obtained from Sigma-Aldrich and used without further purification. Stoichiometric amounts of SrBr$_2$, SrI$_2$, BaBr$_2$, BaI$_2$, EuBr$_2$ and EuI$_2$ are thoroughly mixed by dry grinding in an agate mortar and pestle in an Ar filled glove-box. The powder is sealed in an evacuated quartz tube and heated above the melting point of the reactants and annealed for 24 hours. This is followed by cooling to ambient temperature at a rate of 0.1° C./min. The vertical, melt-based Bridgman technique to grow single-crystals in sealed quartz tubes is used. The temperature gradient is about 30° C./cm and the growth rate 1 mm/h. Samples with varying amount of Eu dopant are synthesized. The products are moisture-sensitive and handled in the Ar glovebox.

Characterization: The purity of the samples is confirmed using powder X-ray diffraction (XRD) with a Bruker Nonius FR591 rotating anode X-ray generator equipped with a copper target and a 50 kV and 60 mA electron beam. X-ray excited emission spectra are measured at the second port of the Bruker Nonius X-ray generator and their spectral response is recorded by a SpectraPro-2150i spectrometer (Acton Research Corp., Acton, Mass.) coupled to a PIXIS: 100B charge-coupled detector (Princeton Instruments, Inc., Trenton, N.J.). Photoluminescence (PL) excitation and emission spectra are measured at room temperature utilizing a Horiba Fluorolog 3 fluorescence spectrometer within the spectral range of 250 nm-800 nm. The X-ray excited decay curves are measured on a custom made pulsed X-ray system consisting of an ultrafast laser (200 fs pulses at 165 kHz), a light-excited X-ray tube, a Hamamatsu R3809U-50 microchannel PMT, and an Ortec 9308 picosecond time analyzer. The impulse response of the system is 100 ps FWHM. Pulse height spectra are recorded under gamma-ray excitation ($^{137}$Cs) with a Hamamatsu R6231-100 photomultiplier tube (PMT) connected to an Ortec 113 preamplifier, an Ortec 672 spectroscopic amplifier and an Ortec EASY-MCA-8K multichannel analyzer. The PMT high voltage was fixed at 650 V. Samples are optically coupled onto the window of the PMT with Viscasil 600000 (GE) and covered with layers of ultraviolet light reflecting tape (PTFE).

Figure 32:
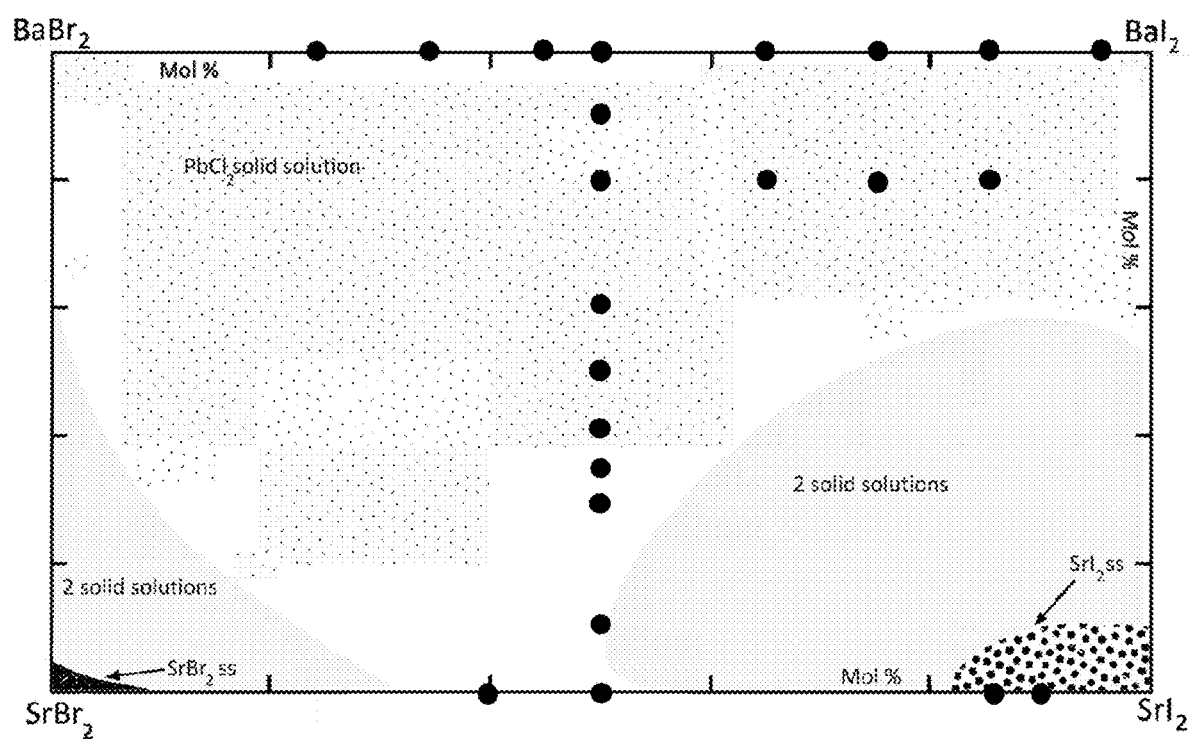
FIG. 32 shows a phase diagram showing the different crystal structures in the $SrI_2$-$SrBr_2$-$BaI_2$-$BaBr_2$ compositions. Black dots are samples with 5% Eu dopant, the properties of which are reported in Tables 8-11.
Figure 33:
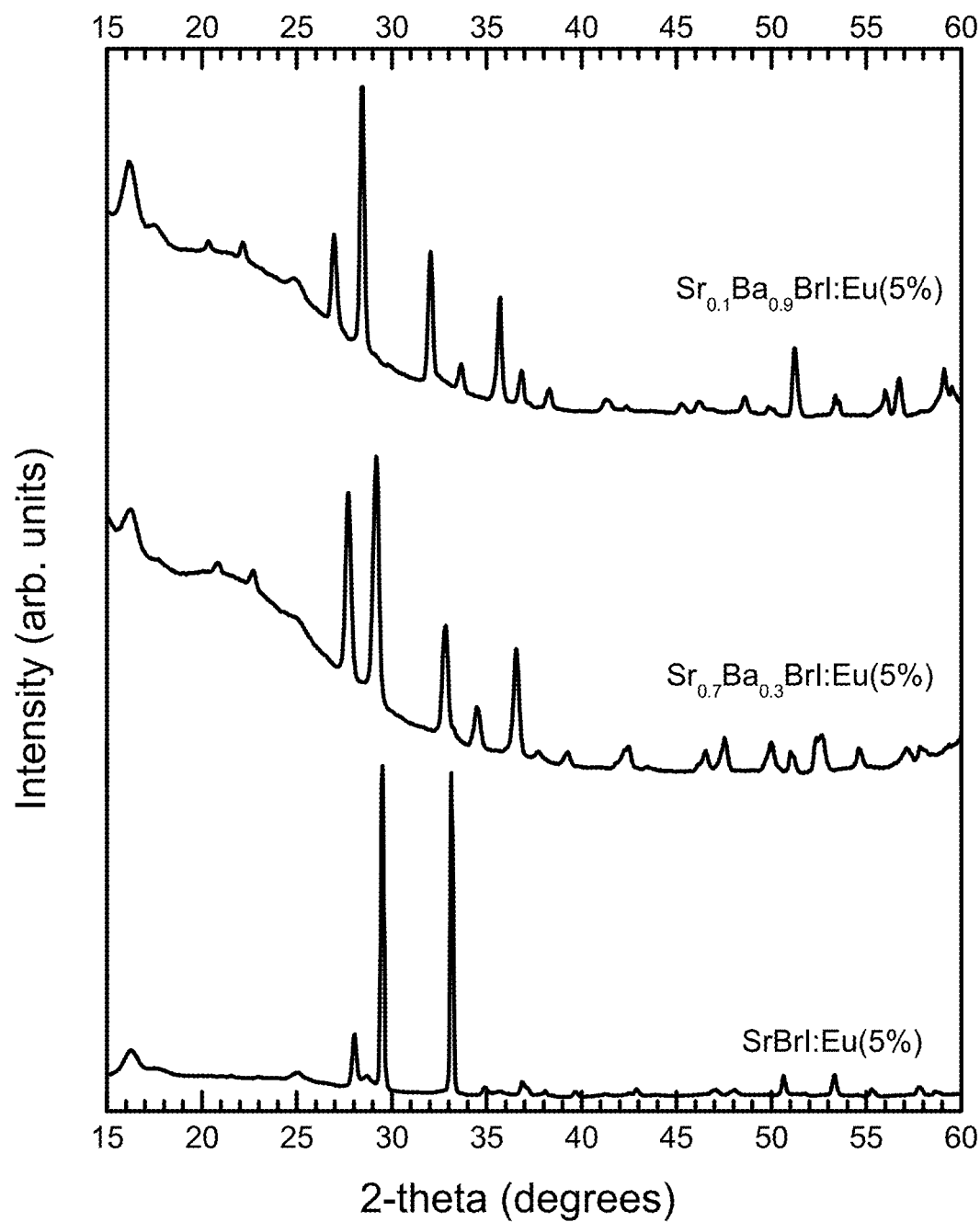
FIG. 33 shows a powder X-ray diffraction pattern for 3 samples with varying Sr/Ba ratios.

The phase diagram for $SrI_2$-$SrBr_2$-$BaI_2$-$BaBr_2$ has been reported in 1968 (Frit, Moakil-Chbany and Hagenmuller, C.R. Seances Acad. Sci. Ser. C. 1968, 267, 1046) and is shown in FIG. 32. Black dots represent samples containing 5% Eu dopant that are shown in Tables 8-11. The phase diagram depicts mainly 3 structure types—the $SrBr_2$, the $SrI_2$ and the $PbCl_2$ structures. In FIG. 33, the X-ray diffraction pattern for 3 samples that show the $PbCl_2$ structure are shown. The patterns are very similar to each other with a slight increase in the lattice parameter due to replacement of smaller Sr atoms by larger Ba atoms in the lattice. No impurities corresponding to the dopant Eu or other reactants are observed.

Figure 34:
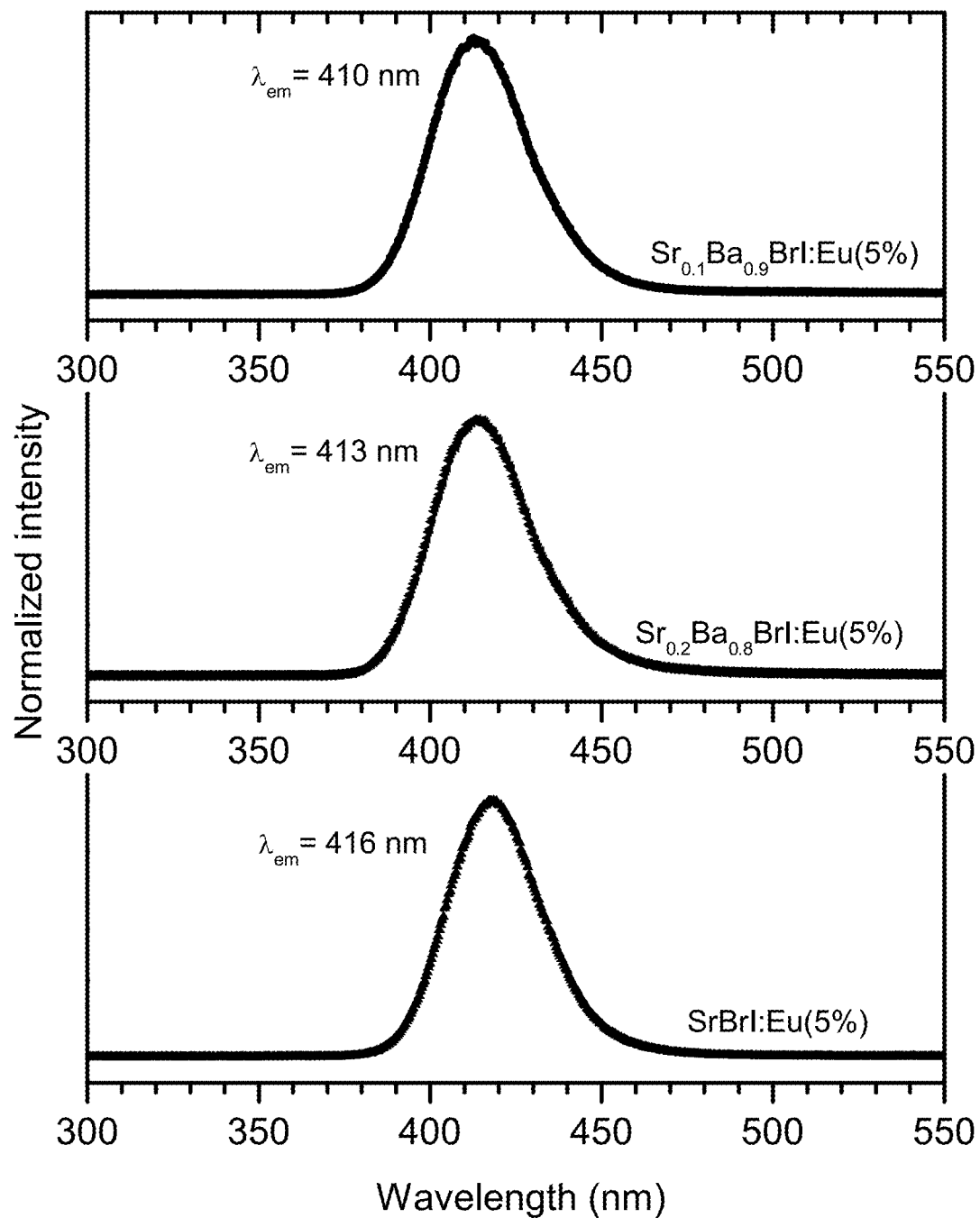
FIG. 34 shows the room temperature X-ray luminescence spectra for 3 samples with varying Sr/Ba ratios.

The emission spectra for the samples on excitation with X-rays are shown in FIG. 34. The emission spectrum for each sample consists of a single emission centered between 410 and 420 nm. The emission is characteristic of the 5d-4f transition of $Eu^{2+}$. Based on the crystal structure and composition, the emission peak position varies between 400 and 450 nm, as seen in Tables 8-11.

Figure 35:
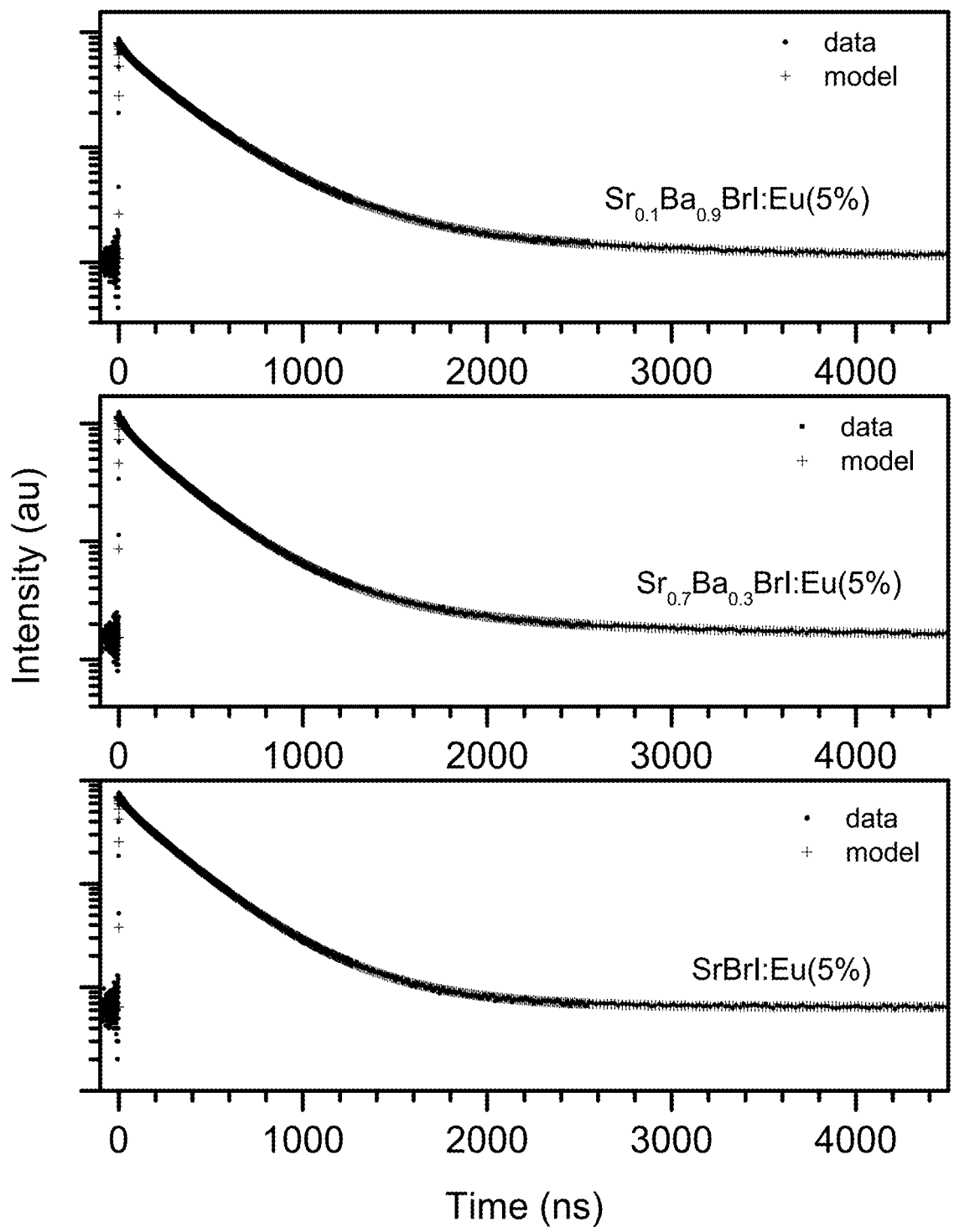
FIG. 35 shows the room temperature pulsed X-ray decay curves for 3 samples with varying Sr/Ba ratios.

In FIG. 35, the X-ray excited decay curves for SrBrI:Eu as well as other samples with varying Sr/Ba ratios are shown. The decay curve for SrBrI:Eu reveals that ~85% of the light decays within 1000 nanoseconds. The decay characteristics vary slightly with composition and crystal structures and are listed in the Tables 8-11.

Figure 36:
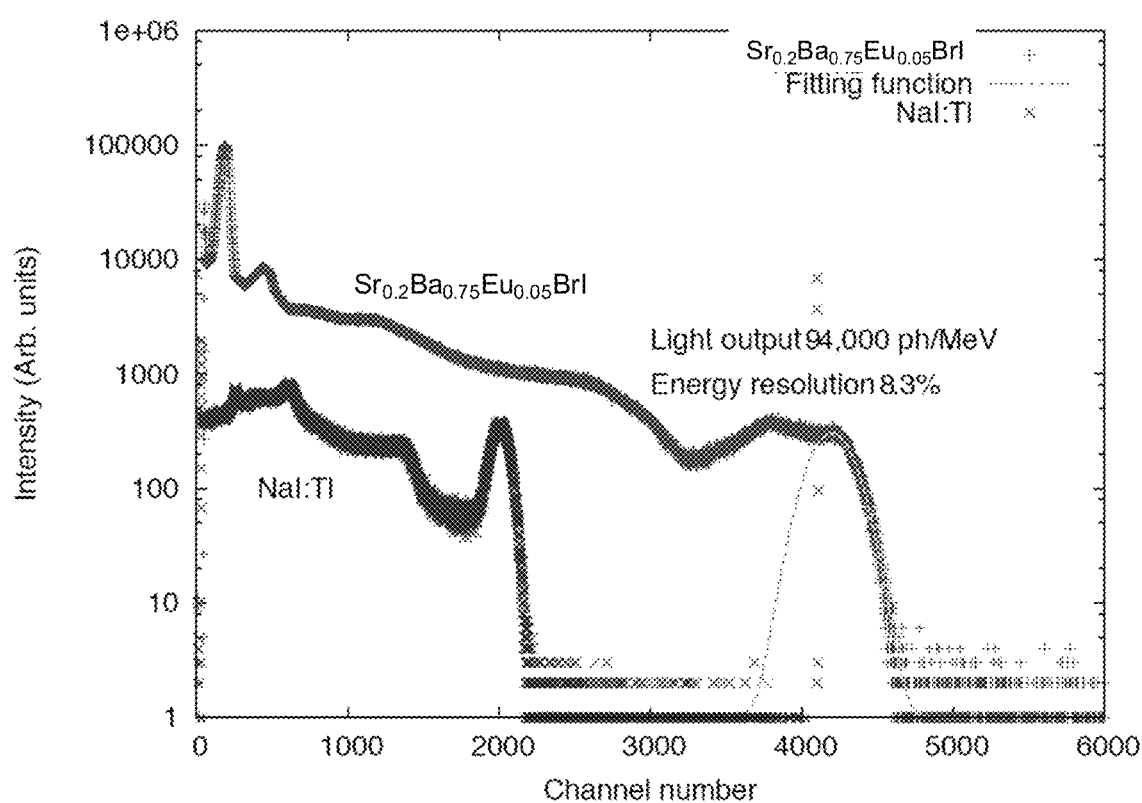
FIG. 36 shows the pulsed height spectra of $Sr_{0.2}Ba_{0.75}Eu_{0.05}BrI$ and NaI:Tl single crystals measured under $^{137}Cs$ (662 keV) gamma ray excitation.

FIG. 36 shows the pulsed height spectrum for a $Sr_{0.2}Ba_{0.75}Eu_{0.05}BrI$ single crystal grown by Bridgman and NaI:Tl (Saint Gobain) under $^{137}Cs$ irradiation (662 keV). The light output is estimated by comparison with the response of NaI:Tl (luminosity 43,000-45,000 ph/MeV. The light output for $Sr_{0.2}Ba_{0.75}Eu_{0.05}BrI$ is estimated to be 94,000±9,000 ph/MeV. The energy resolution is defined as the FWHM of the 662 keV full absorption peak. A value of 8.3% is measured.

TABLE 8

$BaBr_2$—$BaI_2$

| Composition | $\lambda_{em}$ (nm) | Decay components | | | Constant |
|---|---|---|---|---|---|
| | | $1^{st}$ | $2^{nd}$ | $3^{rd}$ | |
| $Ba_{0.95}Eu_{0.05}Br_{1.5}I_{0.5}$ | 410 | 207 ns-11% | 390 ns-67% | 1330 ns-4% | 17% |
| $Ba_{0.95}Eu_{0.05}Br_{1.3}I_{0.7}$ | 410 | 210 ns-12% | 388 ns-67% | 1923 ns-4% | 15% |
| $Ba_{0.95}Eu_{0.05}Br_{1.1}I_{0.9}$ | 411 | 158 ns-4% | 346 ns-67% | 677 ns-9% | 0% |
| $Ba_{0.95}Eu_{0.05}BrI$ | 409 | 133 ns-7% | 313 ns-59% | 741 ns-15% | 0% |
| $Ba_{0.95}Eu_{0.05}Br_{0.7}I_{1.3}$ | 415 | | 352 ns-66% | 1148 ns-15% | 19% |
| $Ba_{0.95}Eu_{0.05}Br_{0.5}I_{1.5}$ | 424 | | 333 ns-65% | 974 ns-19% | 16% |
| $Ba_{0.95}Eu_{0.05}Br_{0.3}I_{1.7}$ | 422 | 210 ns-23% | 373 ns-59% | 1434 ns-9% | 8% |
| $Ba_{0.95}Eu_{0.05}Br_{0.1}I_{1.9}$ | 420 | 174 ns-28% | 411 ns-67% | | 5% |

TABLE 9

BaBrI—SrBrI

| Composition | $\lambda_{em}$ (nm) | Decay components | | | Constant |
|---|---|---|---|---|---|
| | | $1^{st}$ | $2^{nd}$ | $3^{rd}$ | |
| $Ba_{0.95}Eu_{0.05}BrI$ | 409 | 133 ns-7% | 313 ns-59% | 741 ns-15% | 0% |
| $Ba_{0.85}Sr_{0.1}Eu_{0.05}BrI$ | 410 | 226 ns-23% | 415 ns-48% | 2273 ns-8% | 19% |
| $Ba_{0.75}Sr_{0.2}Eu_{0.05}BrI$ | 413 | 241 ns-35% | 471 ns-27% | | 18% |
| $Ba_{0.55}Sr_{0.4}Eu_{0.05}BrI$ | 415 | 178 ns-26% | 376 ns-57% | 5046 ns-6% | 11% |
| $Ba_{0.45}Sr_{0.5}Eu_{0.05}BrI$ | 416 | 242 ns-31% | 388 ns-41% | 887 ns-4% | 16% |
| $Ba_{0.35}Sr_{0.60}Eu_{0.05}BrI$ | 413 | 202 ns-11% | 318 ns-63% | 864-10% | 14% |
| $Ba_{0.3}Sr_{0.65}Eu_{0.05}BrI$ | 414 | 233 ns-29% | 397 ns-40% | 1147 ns-4% | 11% |
| $Ba_{0.25}Sr_{0.7}Eu_{0.05}BrI$ | 418 | 178 ns-68% | 309 ns-12% | | 1% |
| $Ba_{0.10}Sr_{0.05}Eu_{0.05}BrI$ | 416 | | 302 ns-52% | 1094 ns-4% | 27% |
| $Sr_{0.95}Eu_{0.05}BrI$ | 416 | 156 ns-6% | 273 ns-56% | 487 ns-19% | 17% |

TABLE 10

$SrBr_2$—$SrI_2$

| Composition | $\lambda_{em}$ (nm) | Decay components | | | Constant |
|---|---|---|---|---|---|
| | | $1^{st}$ | $2^{nd}$ | $3^{rd}$ | |
| $Sr_{0.95}Eu_{0.05}Br_{1.2}I_{0.8}$ | 417 | | 254 ns-39% | 456 ns-26% | 34% |
| $Sr_{0.95}Eu_{0.05}BrI$ | 416 | 156 ns-6% | 273 ns-56% | 487 ns-19% | 17% |
| $Sr_{0.95}Eu_{0.05}Br_{0.3}I_{1.7}$ | 430 | | 237 ns-35% | 593 ns-54% | 9% |
| $Sr_{0.95}Eu_{0.05}Br_{0.2}I_{1.8}$ | 435 | | 241 ns-16% | 984 ns-68% | 15% |

TABLE 11

(Sr, Ba)(Br, I)$_2$

| Composition | λem (nm) | Decay components | | | Constant |
|---|---|---|---|---|---|
| | | 1$^{st}$ | 2$^{nd}$ | 3$^{rd}$ | |
| Ba$_{0.75}$Sr$_{0.2}$Eu$_{0.05}$Br$_{0.7}$I$_{1.3}$ | 423 | 311 ns-47% | 611 ns-42% | 4761 ns-15% | 5% |
| Ba$_{0.75}$Sr$_{0.2}$Eu$_{0.05}$Br$_{0.5}$I$_{1.5}$ | 425 | 305 ns-43% | 611 ns-44% | 4435 ns-14% | 6% |
| Ba$_{0.75}$Sr$_{0.2}$Eu$_{0.05}$Br$_{0.3}$I$_{1.7}$ | 421 | 373 ns-58% | 951 ns-22% | | 0% |
| Ba$_{0.55}$Sr$_{0.4}$Eu$_{0.05}$Br$_{0.3}$I$_{1.7}$ | 427 | 267 ns-5% | 419 ns-32% | 1067 ns-11% | 53% |
| Ba$_{0.5}$Sr$_{0.45}$Eu$_{0.05}$Br$_{0.6}$I$_{1.4}$ | 416 | 306 ns-82% | | 1077 ns-7% | 8% |

These inorganic scintillator crystals are useful for national security purposes, such as detecting nuclear material.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An inorganic scintillator having the formula: Sr$_y$Ba$_z$CsX$_5$:Ln$^1_x$ (IIa); wherein X is Br, Cl, I, or a mixture thereof; Ln$^1$ is a lanthanide with a valence of 2+; x has a value having the range 0<x<2; y has a value having the range 0<y<2; z has a value having the range 0≤z<2; y+z>0; and, x+y+z=2.
2. The inorganic scintillator of claim 1, wherein X is Br.
3. The inorganic scintillator of claim 1, wherein X is Cl.
4. The inorganic scintillator of claim 1, wherein X is I.
5. The inorganic scintillator of claim 1, wherein Ln' is Eu or Yb.
6. The inorganic scintillator of claim 1, wherein y has a value of 0, and z has a value having the range 0<z<2.
7. The inorganic scintillator of claim 1, wherein x has a value having the range 0<z<0.2.
8. The inorganic scintillator of claim 7, wherein x has a value having the range 0.02x<0.2.
9. The inorganic scintillator of claim 1, wherein the inorganic scintillator is a single crystal having at least one dimension of a length of at least 1 mm, or a length at least sufficient to stop or absorb gamma-radiation.
10. A gamma ray detector comprising the inorganic scintillator of claim 9.
11. An inorganic scintillator having the formula: M$_m$CsX$_5$:Ln$^1$x (IIe); wherein M is Sr; X is Br, Cl, I, or a mixture thereof; Ln$^1$ is a lanthanide with a valence of 2+; x has a value having the range 0<x<2; m has a value having the range 0<m<2; and, x+m=2.
12. The inorganic scintillator of claim 11, wherein X is Br.
13. The inorganic scintillator of claim 11, wherein X is Cl.
14. The inorganic scintillator of claim 11, wherein X is I.
15. The inorganic scintillator of claim 11, wherein Ln$^1$ is Eu or Yb.
16. The inorganic scintillator of claim 11, wherein x has a value having the range 0<x<0.2.
17. The inorganic scintillator of claim 16, wherein x has a value having the range 0.02x<0.2.
18. The inorganic scintillator of claim 11, wherein the inorganic scintillator is a single crystal having at least one dimension of a length of at least 1 mm, or a length at least sufficient to stop or absorb gamma-radiation.
19. A gamma ray detector comprising the inorganic scintillator of claim 18.
20. An inorganic scintillator having the formula: M$_m$CsX$_5$:Ln$^1$x (IIe); wherein M is Ba; X is Cl or I, or a mixture of Br, Cl, and/or I; Ln$^1$ is a lanthanide with a valence of 2+; x has a value having the range 0<x<2; m has a value having the range 0<m<2; and, x+m=2.
21. The inorganic scintillator of claim 20, wherein X is Cl.
22. The inorganic scintillator of claim 20, wherein X is I.
23. The inorganic scintillator of claim 20, wherein Ln$_1$ is Eu or Yb.
24. The inorganic scintillator of claim 20, wherein x has a value having the range 0<x<0.2.
25. The inorganic scintillator of claim 24, wherein x has a value having the range 0.02x<0.2.
26. The inorganic scintillator of claim 20, wherein the inorganic scintillator is a single crystal having at least one dimension of a length of at least 1 mm, or a length at least sufficient to stop or absorb gamma-radiation.
27. A gamma ray detector comprising the inorganic scintillator of claim 26.
28. An inorganic scintillator having the formula: M$_m$CsX$_5$:Ln$^1$x (IIe); wherein M is Ba; X is Br; Ln$^1$ is a lanthanide with a valence of 2+; x has a value having the range 0.02x<0.2; m has a value having the range 0<m<2; and, x+m=2.
29. The inorganic scintillator of claim 28, wherein Ln$^1$ is Eu or Yb.
30. The inorganic scintillator of claim 28, wherein the inorganic scintillator is a single crystal having at least one dimension of a length of at least 1 mm, or a length at least sufficient to stop or absorb gamma-radiation.
31. A gamma ray detector comprising the inorganic scintillator of claim 30.

* * * * *